(12) United States Patent
Zhang et al.

(10) Patent No.: US 12,301,251 B2
(45) Date of Patent: May 13, 2025

(54) SCALABLE SURFACE CODE DECODERS WITH PARALLELIZATION IN TIME

(71) Applicant: Alibaba Damo (Hangzhou) Technology Co., Ltd., Zhejiang (CN)

(72) Inventors: Fang Zhang, Bellevue, WA (US); Xinyu Tan, Bellevue, WA (US); Rui Chao, Bellevue, WA (US); Yaoyun Shi, Bellevue, WA (US); Jianxin Chen, Kirland, WA (US)

(73) Assignee: Alibaba Damo (Hangzhou) Technology Co., Ltd., Hangzhou (CN)

( * ) Notice: Subject to any disclaimer, the term of this patent is extended or adjusted under 35 U.S.C. 154(b) by 0 days.

(21) Appl. No.: 18/449,978

(22) Filed: Aug. 15, 2023

(65) Prior Publication Data
US 2024/0063821 A1 Feb. 22, 2024

Related U.S. Application Data

(60) Provisional application No. 63/373,182, filed on Aug. 22, 2022.

(51) Int. Cl.
*H03M 13/11* (2006.01)
*G06N 10/70* (2022.01)

(52) U.S. Cl.
CPC ........ *H03M 13/1108* (2013.01); *G06N 10/70* (2022.01); *H03M 13/1134* (2013.01)

(58) Field of Classification Search
CPC .......... H03M 13/1108; H03M 13/1134; G06N 10/70
See application file for complete search history.

(56) References Cited

U.S. PATENT DOCUMENTS

| | | |
|---|---|---|
| 2019/0044543 A1 | 2/2019 | Chamberland et al. |
| 2021/0126652 A1 | 4/2021 | Delfosse et al. |
| 2022/0216884 A1 | 7/2022 | Delfosse et al. |

(Continued)

OTHER PUBLICATIONS

Acharya et al., "Suppressing quantum errors by scaling a surface code logical qubit," arXiv:2207.06431v2, 22 pages, 2022.

(Continued)

*Primary Examiner* — Thien Nguyen
(74) *Attorney, Agent, or Firm* — Finnegan, Henderson, Farabow, Garrett & Dunner, LLP

(57) ABSTRACT

Scalable, parallelizable quantum error correction on surface codes can be performed using a decoder graph. Overlapping decoder graph windows can be generated using the decoder graph. First corrections can be independently determined for each of the overlapping decoder graph windows. First core corrections can be retained for core regions of each of the overlapping decoder graph windows. Non-overlapping decoder graph windows can be generated using the decoder graph. The temporal boundaries of the non-overlapping decoder graph windows can be the temporal boundaries of the corrected core regions of the overlapping decoder graph windows. Second corrections can be independently determined for each of the non-overlapping decoder graph windows based on the temporal boundaries of the corrected core regions. The first core corrections and the second corrections can be combined to form a complete set of corrections for the decoder graph.

20 Claims, 20 Drawing Sheets

(56) References Cited

U.S. PATENT DOCUMENTS

2024/0167731 A1\* 5/2024 Liang .................. F24T 10/17
2024/0168731 A1\* 5/2024 Litinski ................ G06N 10/70

OTHER PUBLICATIONS

Bartolucci et al., "Fusion-based quantum computation," arXiv preprint arXiv:2101.09310, 25 pages, 2021.
Das et al., "Lilliput: A Lightweight Low-Latency Lookup-Table Based Decoder for Near-term Quantum Error Correction," arXiv preprint arXiv:2108.06569, 12 pages, 2021.
Delfosse et al., "Almost-linear time decoding algorithm for topological codes," Quantum 5, 595, 13 pages, 2021.
Gidney, Craig, "Stability Experiments: The Overlooked Dual of Memory Experiments," arXiv preprint arXiv:2204.13834, 12 pages, 2022.
PCT International Search Report and Written Opinion mailed Nov. 10, 2023, issued in corresponding International Application No. PCT/CN2023/114107(6 pgs.).

\* cited by examiner

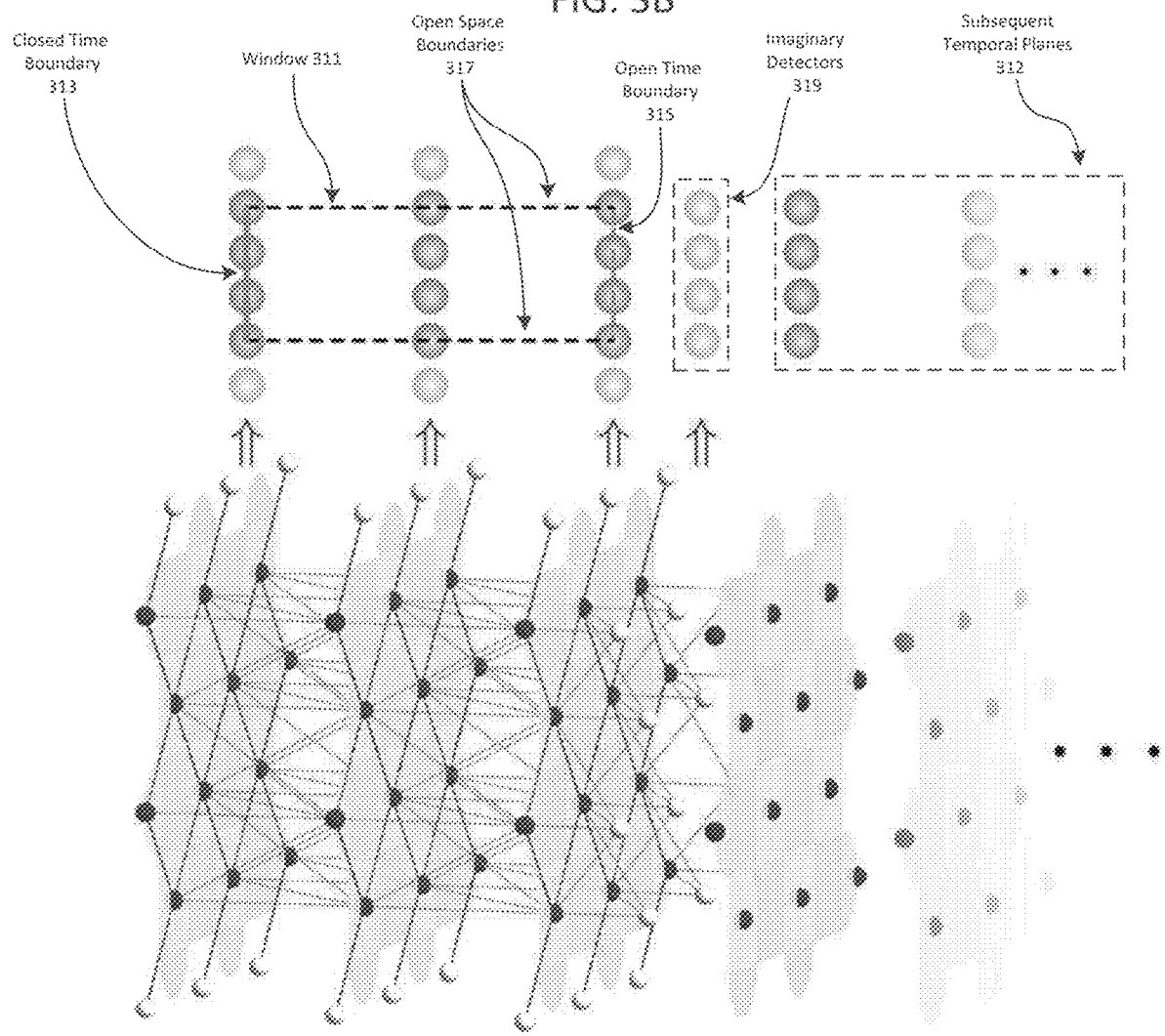

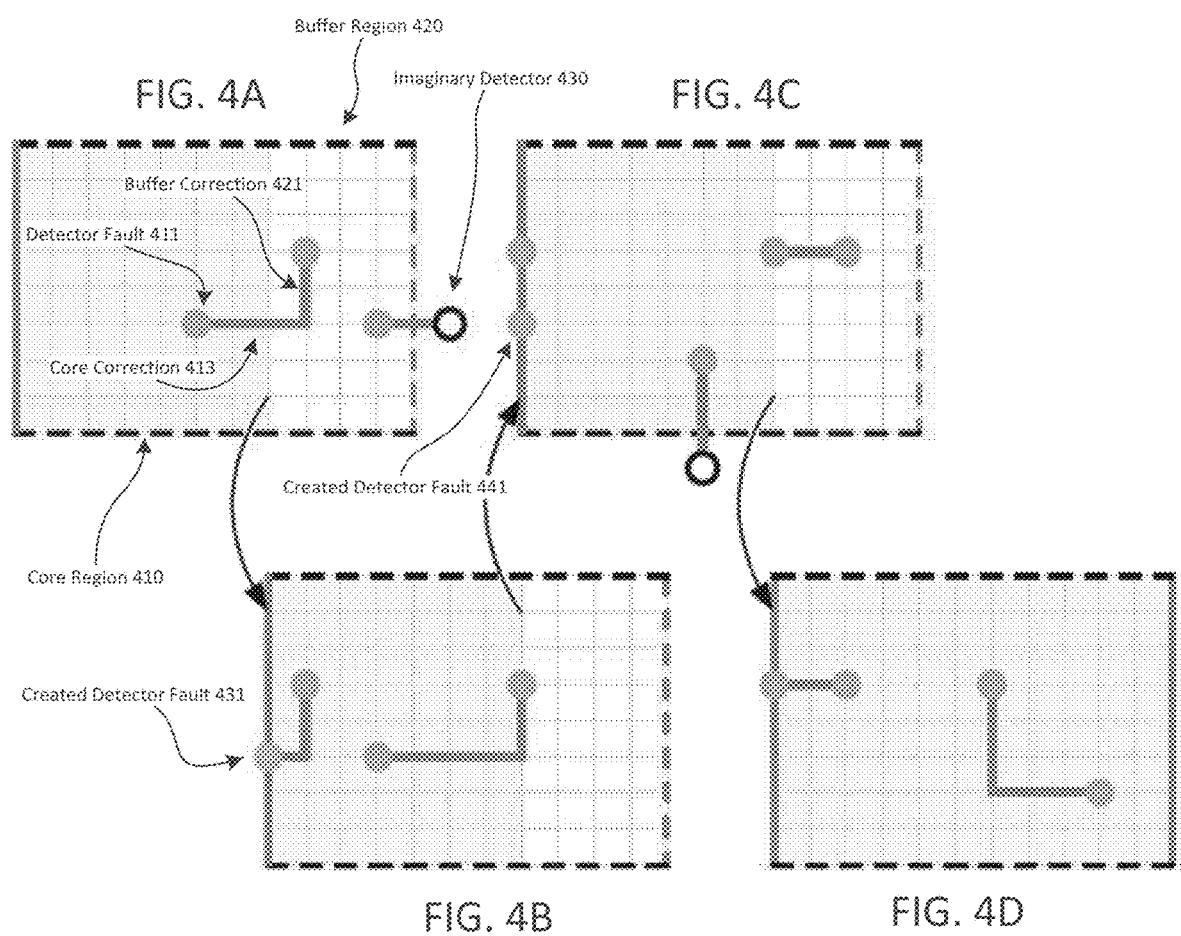

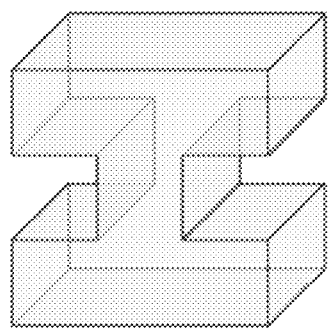  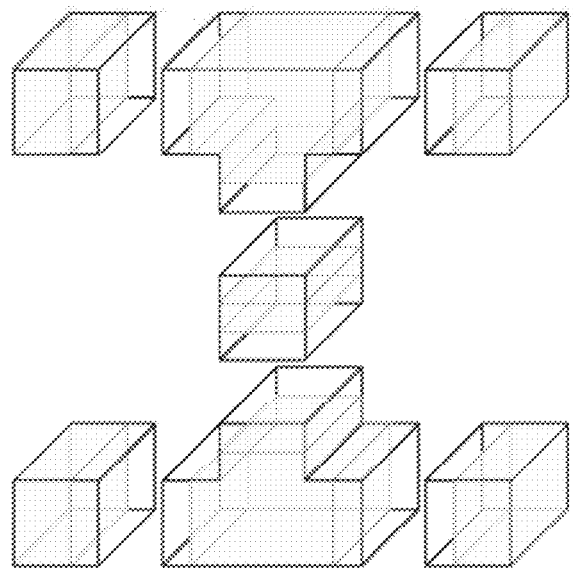
FIG. 14A
FIG. 14B

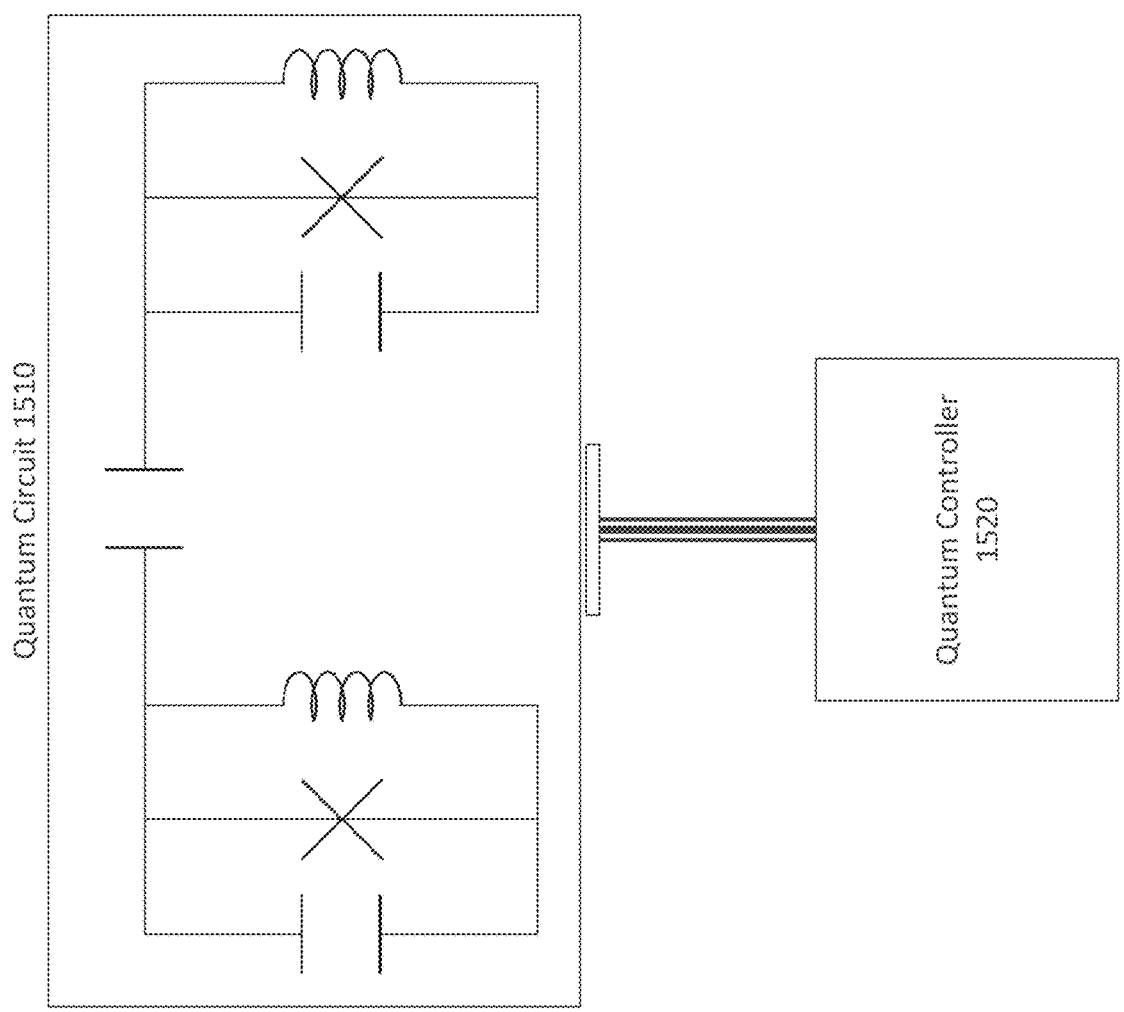

SCALABLE SURFACE CODE DECODERS WITH PARALLELIZATION IN TIME

CROSS-REFERENCE TO RELATED APPLICATIONS

The present disclosure claims the benefit of priority to U.S. Provisional Patent Application No. 63/373,182, filed Aug. 22, 2022, which is incorporated herein by reference in its entirety.

TECHNICAL FIELD

The present disclosure generally relates to quantum error correction (QEC). In particular, the present disclose relates to decoder designs for QEC using surface codes.

BACKGROUND

Fault-tolerance theory allows scalable and universal quantum computation provided that the physical error rates are below a threshold. Multiple fault-tolerance architectures have been proposed, but these proposals generally assume instantaneous classical computations when estimating the threshold and resource overhead. In practice, existing architectures may require a high decoding throughput—the amount of error syndromes that can be processed by a decoder in unit time. But existing decoder architectures lack a suitable combination of accuracy, throughput, and scalability. Decoding schemes for the surface code can have high thresholds but inadequate decoding throughput. Local decoding schemes can be fast and somewhat scalable, but can obtain speed at the expense of accuracy.

SUMMARY

The disclosed systems and methods enable scalable parallelizable processing of a decoder graph using windowed decoding. Overlapping windows are generated using the decoder graph. These windows are processed independently to generate corrections. Because these windows are processed independently, they can be processed in parallel. Non-overlapping windows, each interposed between corrected core regions of two overlapping adjacent overlapping window, are processed independently to reconcile any inconsistencies between the corrected core regions.

The disclosed embodiments include methods of quantum error correction. A method of quantum error correction consistent with disclosed embodiments can include multiple operations. The method can include obtaining multiple cycles of error syndromes for a surface code. The method can further include generating a decoder graph using the error syndromes. The method can further include determining first corrections that annihilate faults within a first decoder window on the decoder graph, the first decoder window having two open time boundaries. The method can further include retaining first corrections on a core region of the first decoder window, the core region having a first boundary. The method can further include determining second corrections that annihilate faults within a second decoder window on the decoder graph, the second decoder window having two closed time boundaries, a first one of the two closed time boundaries being the first boundary. The method can further include providing an indication of the retained first corrections and the second corrections to enable correction of the surface code.

The disclosed embodiments further include systems for performing methods of quantum error correction consistent with disclosed embodiments.

The disclosed embodiments further include non-transitory, computer-readable media containing instructions that, when executed by systems consistent with disclosed embodiments, cause the systems to perform the method of quantum error correction.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which comprise a part of this specification, illustrate several embodiments and, together with the description, serve to explain the principles and features of the disclosed embodiments. In the drawings:

FIGS. 3A and 3B depict two views of a window on a Z-type decoder graph, consistent with disclosed embodiments.

FIGS. 4A to 4D depict a forward window approach to sliding window decoders, consistent with disclosed embodiments.

FIG. 14A depicts an exemplary overall decoder graph for a two-qubit parity measurement, consistent with disclosed embodiments.

FIG. 14B depicts decomposition of the overall decoder graph of FIG. 14A into smaller decoder windows suitable for independent processing, consistent with disclosed embodiments.

FIG. 15 depicts a schematic of an exemplary quantum circuit suitable for implementing quantum error correction, in accordance with disclosed embodiments.

DETAILED DESCRIPTION

Figure 1C:
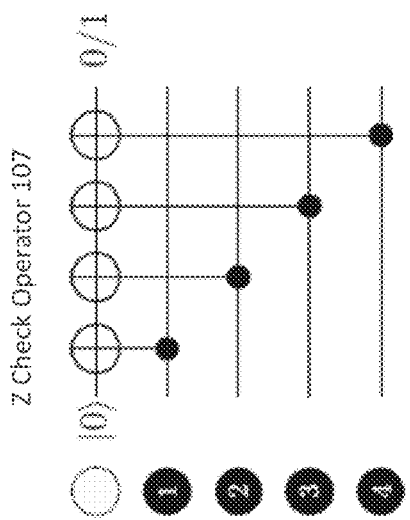
FIGS. 1A to 1C depict a qubit layout and a fault-tolerant syndrome-extraction circuit for a rotated surface code, consistent with disclosed embodiments.

Reference will now be made in detail to exemplary embodiments, discussed with regards to the accompanying drawings. In some instances, the same reference numbers will be used throughout the drawings and the following description to refer to the same or like parts. Unless otherwise defined, technical or scientific terms have the meaning commonly understood by one of ordinary skill in the art. The disclosed embodiments are described in sufficient detail to enable those skilled in the art to practice the disclosed embodiments. It is to be understood that other embodiments may be utilized and that changes may be made without departing from the scope of the disclosed embodiments. Thus, the materials, methods, and examples are illustrative only and are not intended to be necessarily limiting.

The surface code decoders (e.g., decoders) consistent with disclosed embodiments can provide high accuracy, scalability, and throughput. Such decoders can be configured to process windowed portions of a decoder graph. The decoders can identify corrections that annihilate detected defects in such windowed portions. The corrections can be a set of edges in the decoder graph and a defect can be annihilated if it is incident to an odd number of edges included in the set. The windowed portions can include non-overlapping regions (core regions) and overlapping regions (buffer regions). The decoders can then process boundaries (which can also be described as "seams" that join two core regions) between core regions. Corrections in core regions can be expressed as updated defects in the boundaries. The decoders can then identify corrections in the boundaries that annihilate the updated defects.

Consistent with disclosed embodiments, the decoders can process the windowed portions of the decoder graph in parallel or process the boundaries in parallel. This parallelism supports improved scalability. While conventional, sequential decoders may have difficulty maintaining adequate throughput when code distance increases, the envisioned decoders can maintain sufficient throughput as code distance increases, as given sufficient parallel processing units (e.g., cores, processors, FPGAs, ASICs, hardware accelerators, or the like). Furthermore, the envisioned systems and methods reduce communication requirements parallel processing units, as windowed portions of the decoder graph can be processed independently. Reduced communication requirements can simplify system architectures. Throughput requirement can be satisfied by using additional cores or processors, rather than requiring faster processors. Also, the number of parallel processing units needed may only scale with the speed of the quantum hardware and the code distance, not with the length of the quantum computation.

Accordingly, the disclosed embodiments can enable QEC of surface codes having greater code distances, while reducing system architecture requirements and permitting simpler components. Thus, the disclosed embodiments constitute a technical improvement in the field of QEC.

Figure 1B:
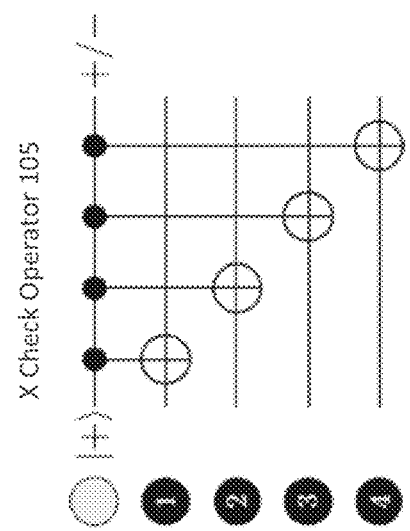
Figure 1A:
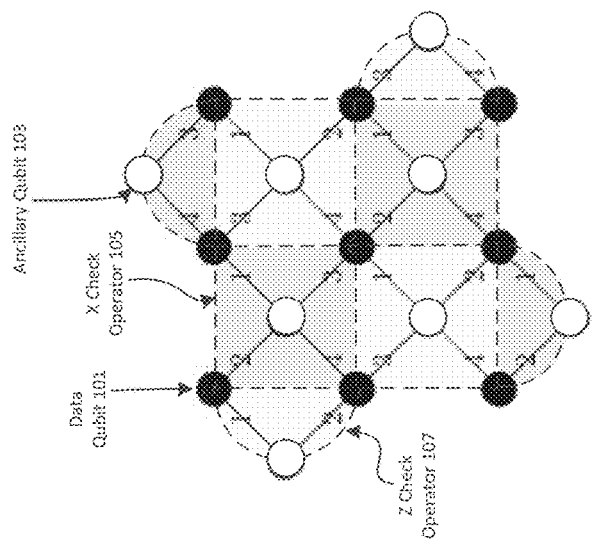

FIGS. 1A to 1C depict a qubit layout and a fault-tolerant syndrome-extraction circuit for a rotated surface code $[[d^2, 1, d]]$. FIG. 1A depicts a qubit layout for a d=3 rotated surface code. Data qubits (black) reside on the plaquette corners. Check operators of X (grey) and Z (white) types are measured by the ancilla qubits residing on the plaquette centers, using the circuits in FIG. 1B and FIG. 1C, respectively. First, ancillas can be prepared in the $|+\rangle$ or $|0\rangle$ state. Second, CNOT gates can be applied on qubit pairs connected with black links, in the order specified by the numbers on the plaquette corners. Finally, the ancillas can be measured in the X or Z basis, respectively.

In a quantum memory experiment (e.g., a test of the ability of a quantum memory to store quantum states for subsequent retrieval), the code patch can be prepared in a logical basis state chosen from $\{|\bar{0}\rangle, |\bar{1}\rangle, |\bar{+}\rangle, |\bar{-}\rangle,\}$ by initializing all the data qubits into the corresponding physical basis state $\{|0\rangle, |1\rangle, |+\rangle, |-\rangle,\}$. For example, the data qubits can first be initialized to the state $|0\rangle$. Then, a syndrome-extraction circuit (e.g., as depicted in FIGS. 1B and 1C) can be repeatedly applied for n cycles to obtain syndromes $$\sigma_i^X, \sigma_i^Z \in \{0, 1\}^{\frac{d^2-1}{2}}$$

of the X- and Z-type check operators, respectively, for i=1, ..., n. Finally, all the data qubits in the physical basis corresponding to the logical basis used during the preparation can be measured to obtain outcomes $m \in \{0,1\}^{d^2}$. In this example, all the data qubits can be measured in the Z basis to obtain the outcomes.

The measurement outcomes $\sigma_i$ on the ancillae and m on the data qubits constitute the input to a decoder, which will return a binary outcome. If the outcome is consistent with the fiducial logical state, the decoding succeeds; otherwise, a logical error has occurred. In practice, $\sigma_i$ and m are usually preprocessed before being fed into a graph-based decoder.

Consistent with disclosed embodiments, a quantum memory experiment can measure preservation of an initial logical state $|\bar{0}\rangle$. The syndrome-extraction circuit is assumed to be fault-tolerant and the whole circuit of the quantum memory experiment is assumed to be afflicted with stochastic Pauli errors. Specifically, each gate, qubit idling, and initialization (resp., measurement) is modeled as the ideal operation followed (resp., preceded) by a random Pauli, referred to as a fault, supported on the involved qubit(s).

For the surface code, each cycle of detectors is the XOR of two consecutive cycles of syndromes. Let $$\sigma_{n+1}^Z(m) \in \{0, 1\}^{\frac{d^2-1}{2}}$$

be the syndromes of the Z-type check operators evaluated from the data qubit measurement outcomes m. Then:

$$\delta_1^Z = \sigma_1^Z$$

$$\delta_i^P = \sigma_i^P = \sigma_{i-1}^P, P \in \{X, Z\}, i=2,3,\ldots,n$$

$$\delta_{n+1}^Z = \sigma_{n+1}^Z(m) \oplus \sigma_n^Z$$

Thus $\sigma_i^X \in \{0,1\}^{d^2-1}$ for i=2, ..., n are real X-type detectors and $\sigma_i^Z \in \{0,1\}^{d^2-1}$ for i=1, ..., n+1 are real Z-type detectors.

Given these assumptions about the circuit and noise model, detectors are 0 in the absence of faults; thus, any detectors with value 1 indicate the presence of faults.

Furthermore, the occurrence of each fault flips at most two detectors of each type (X or Z). A detector can be "open" when there exists a fault which flips that detector but no other detector of the same type, otherwise, it is closed.

Assuming the standard stochastic Pauli noise model and using the syndrome-extraction circuits in FIGS. 1B and 1C, it is easy to verify that any single fault in the whole memory experiment will flip one or two bits among all bits of the detection events.

A surface code can have two types of space boundaries. For example, in FIG. 1A, the top and bottom boundaries are described herein as X boundaries while the left and right boundaries are described herein as Z boundaries. From the perspective of correcting X errors, the Z boundaries are more secure: In the middle of a Z boundary, an X error on a data qubit would always flip two Z stabilizers, while on an X boundary a single X error would only flip one Z stabilizer.

A boundary detection event in a decoder graph is called open if and only if there exist some faults which flip this event only; otherwise, it is closed. When a boundary detection event is open, it is associated with a virtual event such that for every fault that only flips this boundary detection event, it also flips the associated virtual event. Thus, Z boundaries are described herein as closed space boundaries because they do not need any virtual Z stabilizers. X boundaries are described herein as open space boundaries. Similarly, in the decoder graph for Z errors, X boundaries are open and Z boundaries are closed. A boundary in a decoder graph is called open if every vertex on this boundary is open. A boundary is closed if it is not open.

In some embodiments, the decoder graph can be defined such that all boundary vertices are combined into one, which has the advantage that its value would be known (since the total number of stabilizers flipped, real and virtual combined, must be even). This simplification may help with the implementation of the decoding algorithm but is not inherent in the model.

One way to intuitively justify the words "open" and "closed" is by looking at the forms of undetectable errors. For codes without space boundaries (such as the toric code), an undetectable error always looks like a cycle or a combination of cycles, either topologically trivial (in which case it will never cause a logical error) or not (in which case it may be a logical operator). For codes with space boundaries, an undetectable error can also be a path with both ends at the open boundaries, as if the path goes into and out of the code patch through those boundaries.

For the disclosed 3D decoder graphs, time boundaries can be defined at the time of data qubits initialization and final data qubits measurements. Each time boundary can also be classified as open or closed given a specific type of errors and the execution details. Given a quantum memory experiment for a logical qubit $|\bar{0}\rangle$. For the decoder graph derived from Z syndromes, both time boundaries are closed since every fault flips exactly two Z detection events (including the virtual vertices on the space boundaries).

Example: Suppose there is only a Z stabilizer measurement error during the last cycle of syndrome extraction, i.e., of $\sigma_i^Z=0$ for $i\in\{1, \ldots, n+1\}\setminus\{n\}$ and of $\sigma_i^Z=0 \ldots$ 010 . . . 0. It follows from that there are only two non-trivial detection events in $\delta_n^Z$ and $\delta_{n+1}^Z$ respectively. The edge connecting these two detection events indicate the Z stabilizer measurement error.

Example: Suppose there is only a data qubit measurement error at the end of the memory experiment. Given have of $\sigma_i^Z=0$ for $i\in\{1, \ldots, n\}$. In the final set of Z syndromes $\sigma_{n+1}^Z$ based on the data qubit measurement results, one flipped data qubit affects all the stabilizers that it involves. Therefore, $\sigma_{n+1}^Z$ has 1 or 2 non-trivial syndromes and $\delta_{n+1}^Z$ has 1 or 2 non-virtual detection events. Because of the virtual detection events on X space boundaries, any single data qubit measurement fault flips exactly two detection events.

However, for the decoder graph derived from X syndromes, the outcome of the first cycle of X stabilizer extraction can be a random binary string even if there are no errors. Therefore, it is necessary to make the initial time boundary open (i.e., allow the bottom detection events to connect to some virtual vertices) to address those non-trivial syndrome measurement results. Similarly, the ending time boundary for X syndromes also needs to be open. The final measurement of the data qubits in the Z basis does not provide any additional information about the X syndromes.

The quantum memory experiment must close or open the time boundaries according to the specific type of errors. In some instances, the quantum memory experiment can be designed to prevent the logical Z operator from being flipped (an odd number of times). But if one of the time boundaries is open (e.g., if the decoder does not make use of the Z measurement results on data qubits during initialization), then there will be low-weight (i.e., short) undetectable X errors with both endpoints on that time boundary. Furthermore, such an undetectable X error can easily flip the logical Z operator, violating the principle that only at least $[d/2]$ physical errors can cause a failure. On the other hand, when both time boundaries are closed, the only open boundaries are the X space boundaries, and low-weight X errors starting and ending at one of those boundaries can only flip the logical Z operator an even number of times. To flip the logical Z operator, an error must cross from one X boundary to the other X boundary, but then it is a logical operator with weight$\geq d$.

With regards to Z errors, if the t=0 and t=T boundaries are closed for X errors, then they are open for Z errors. Indeed, in such a quantum memory experiment, there are low-weight undetectable Z errors that flip the logical X operator, but this does not matter because the experiment does not care about the logical X operator anyway. Similarly, suppose that the logical qubit is initialized to $|\bar{0}\rangle$, but measured in the X basis. In this case, the t=0 boundary is an open boundary for Z errors, and this can cause undetectable logical X operator flips. But the result of this experiment is intended to be uniformly random anyway, and a uniform random binary variable remains uniformly random regardless of whether it is flipped or with what probability, so the behavior of this experiment would still be correct.

Figure 2A:
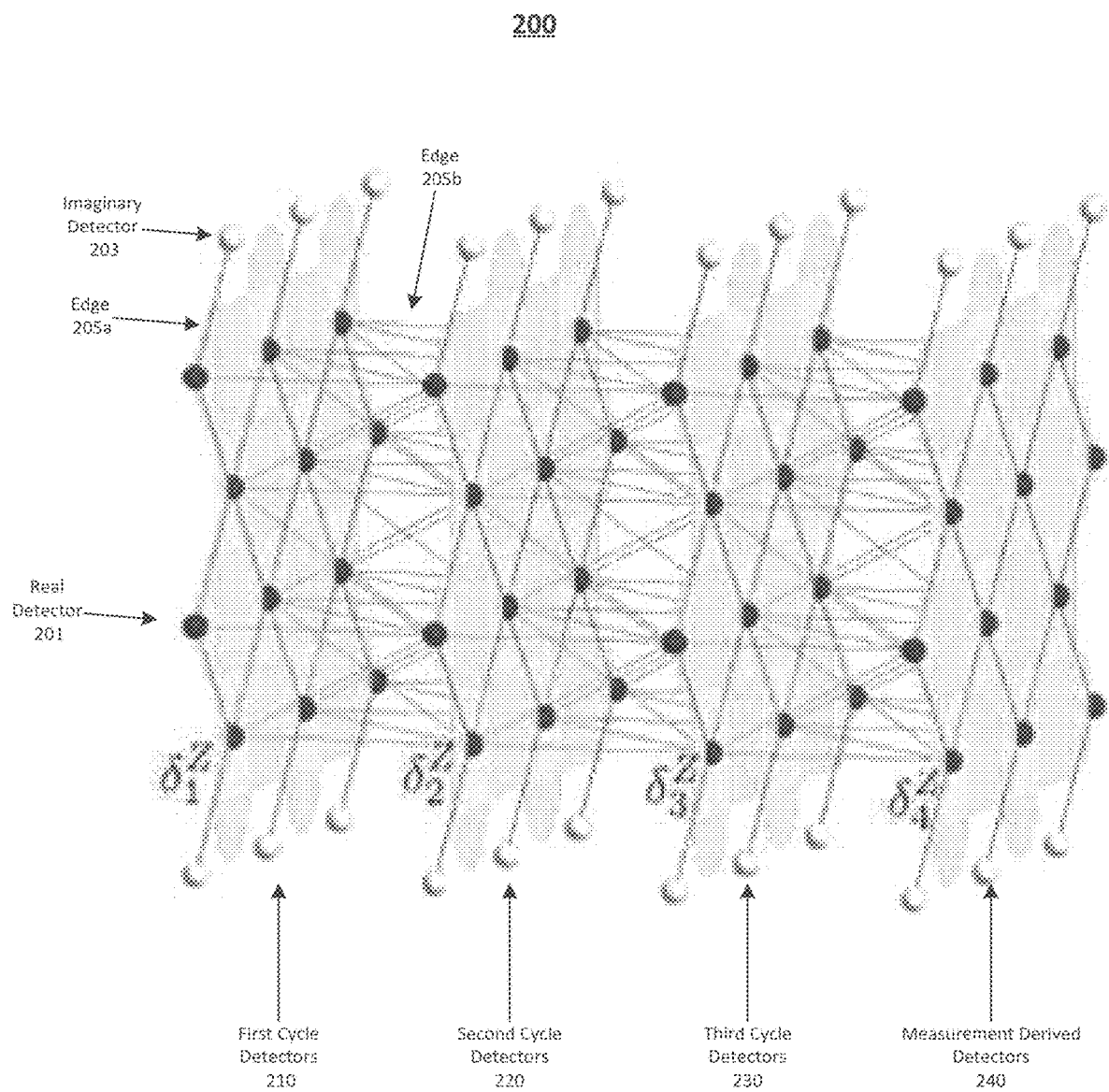
FIGS. 2A and 2B respectively depicts Z-type and X-type decoder graphs, consistent with disclosed embodiments.

FIG. 2A depicts a Z-type decoder graph 200 consistent with disclosed embodiments. Decoder graph 200 can be constructed by adding a solid vertex (e.g., real detector 201) for each real Z-type detector. An edge connecting two vertices (e.g., edge 205a, edge 205b, or the like) can be added to decoder graph 200 when a single fault changes the value of both corresponding detectors. For each solid vertex corresponding to an open detector, an imaginary detector vertex (e.g., imaginary detector 203) and an edge connecting the solid vertex and the imaginary detector vertex can be added to decoder graph 200. Each edge in decoder graph 200 thus represents an equivalence class of faults that flip the same two detectors. In this example, three cycles of syndromes were obtained before the data qubits were measured. Accordingly, decoder graph 200 includes four layers of vertices. For ease of visualization, vertices are depicted as gathered in sequential planes by their temporal order (e.g., first cycle detectors 210, second cycle detectors 220, third cycle detectors 230, and measurement derived detectors 240).

Figure 2B:
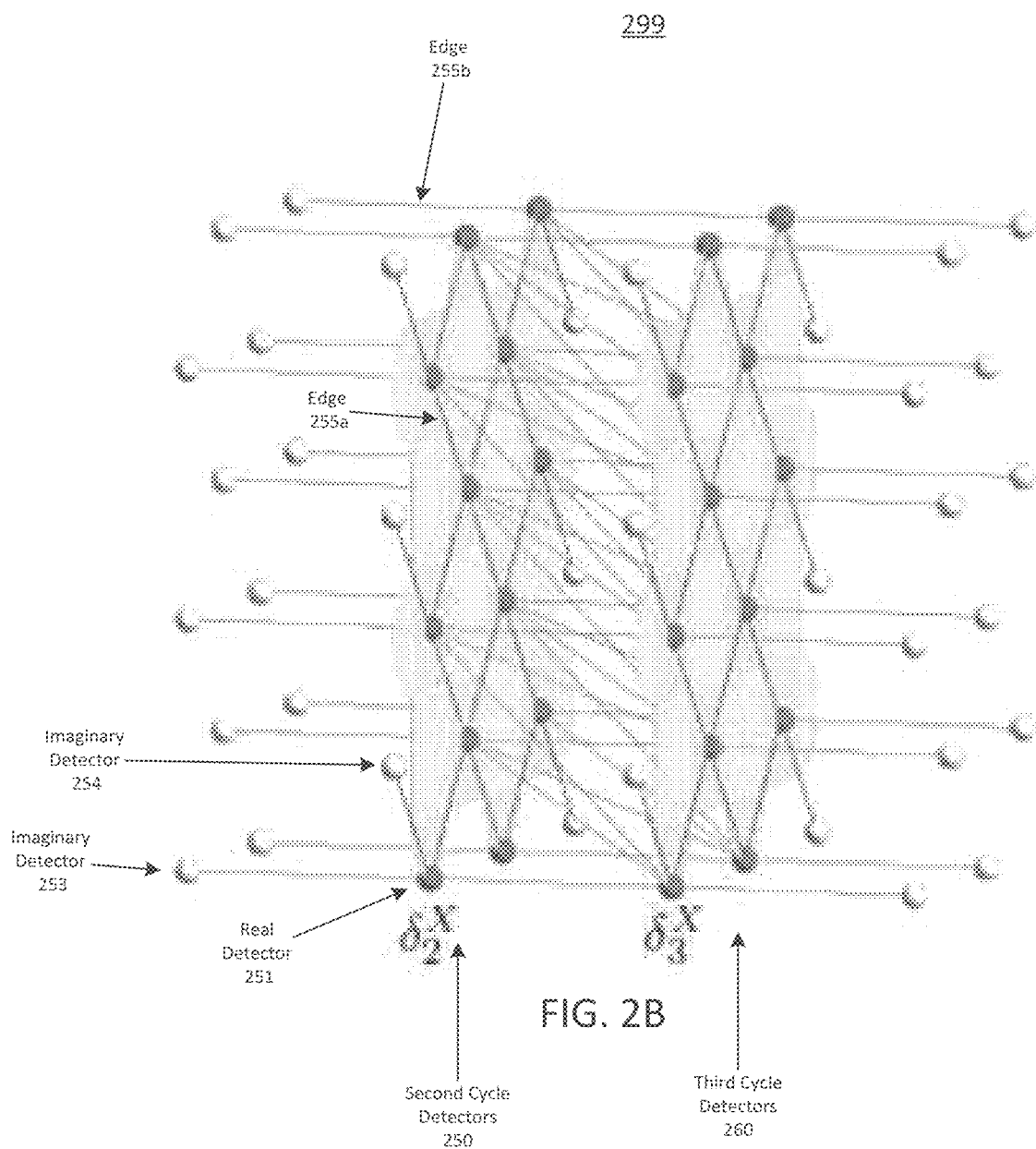

FIG. 2B depicts an X-type decoder graph 299 consistent with disclosed embodiments. Decoder graph 299 can be constructed by adding a solid vertex (e.g., real detector 251) for each real X-type detector. An edge connecting two vertices (e.g., edge 255a, edge 255b, or the like) can be added to decoder graph 299 when a single fault changes the value of both corresponding detectors. For each solid vertex corresponding to an open detector, an imaginary detector vertex (e.g., imaginary detector 253, imaginary detector 254, or the like) and an edge connecting the solid vertex and the imaginary detector vertex can be added to decoder graph 299. Each edge in decoder graph 299 thus represents an equivalence class of faults that flip the same two detectors. In this example, three cycles of syndromes were obtained before the data qubits were measured. Given the definition of X-type detector events, decoder graph 299 includes two layers of vertices. For ease of visualization, vertices are depicted as gathered in sequential planes by their temporal order (e.g., second cycle detectors 250 and third cycle detectors 260).

During the first (or last) cycle of syndrome extraction, a measurement fault on the ancilla of any X-type check operator flips only one detector in $\sigma_2^X$ (or in $\sigma_n^X$). Both time boundaries are therefore open. In some embodiments, as depicted in FIG. 2B, to assist in distinguishing whether a fault affects an ancilla measurement or a boundary data qubit, a real detector on an intersection of space and time boundaries can be connected to two imaginary detectors rather than one. For example, real detector 251 can be connected to imaginary detector 254 (corresponding to the space boundary) and to imaginary detector 253 (corresponding to the time boundary).

Conventional implementations and simulations of quantum memory experiments can perform decoding as an offline process. The entire quantum circuit for the quantum memory experiment can be executed or simulated, resulting in a total of n rounds of error syndromes. Then the entire batch of n rounds of syndromes can be input to the decoder. A decoder that works on a whole batch of syndromes can be described as a batch decoder.

Batch decoders are conceptually simple, demonstrate that QEC can protect quantum information, and demonstrate general ideas (MWPM, UF, etc.) for recovering such quantum information. However, batch decoders can be difficult to scale up temporally. Most current demonstrations of the quantum memory experiment include a limited number of surface code cycles, especially when the code distance d is large (e.g., only n~d surface code cycles may be simulated). But a quantum memory configured to store quantum states for subsequent retrieval would preferably be usable for a number of surface code cycles dependent on the logical error rate per cycle (which should decrease exponentially with the code distance). An approach based on batch decoders needs $O(pnd^2)$ space just to store the syndromes, and thus will quickly run out of memory. Furthermore, after the logical qubit is measured, decoding will take an additional amount of time that scales at least linearly with n, and for some decoding methods may be even longer (e.g., a naive implementation of the MWPM decoder would generate a complete graph with $O(p^2n^2d^4)$ edges, and thus scale quadratically with n).

Consistent with disclosed embodiments, a quantum memory can be configured to support logical operations beyond single-qubit measurement. QEC can support fault-tolerant quantum computation with logical gates. At least one type of logical gate requires measuring an "ancilla" logical qubit entangled with the "data" logical qubit of interest. In surface codes, two such entangled logical qubits form a single connected object in spacetime. Decoding such a logical ancilla measurement with a batch decoder may require all syndromes since the beginning of the data qubit's lifetime. Therefore, decoding time will eventually cause a "backlog" of syndromes that grows exponentially with the number of logical gates, making fault-tolerant quantum computation infeasible.

In some implementations, a relatively small amount of error syndromes, e.g., in a d×d×O(d) region, can be used to decode any part of the 3D surface code structure in space-time. These d×d×O(d) regions can be formalized as windows, yielding the concept of a sliding-window decoder. The sliding window decoder can be configured to process a single window at a time. Within each window, an inner decoder can determine a set of edges from the decoder graph that can annihilate all defects. A defect can be annihilated if it is incident to an odd number of edges in the determined set of edges. The edges in the set of edges can be corrections. The corrections assembled from all windows can collectively annihilate every observed defect in the whole decoder graph. Furthermore, the sliding-window decoders can exploit the fact that any two consecutive windows overlap. These overlaps allow each window to only retain a relatively trustworthy subset of the corrections for later assembly and discard the rest.

FIGS. 3A and 3B depict two views of a window on a Z-type decoder graph, consistent with disclosed embodiments. The window can include detectors from $\delta_{1+ks}^Z$ to $\delta_{w+ks}^Z$, where w is the width of the window, s<w is the step size between windows, and k is the number of the window (e.g., first, second, third, etc.) In this example, the window has a width of three and the Z-type decoder graph is constructed from more than three cycles of syndromes, consistent with disclosed embodiments. The decoder graph can be constructed using real detectors, imaginary detectors, and edges, as described herein. FIG. 3A depicts the surface code plaquettes corresponding to the detectors and the edges connecting the detectors, while FIG. 3B depicts a top view of the detectors in each sequential temporal plane. FIG. 3B further depicts the real detectors and temporal planes included in window 311, and the subsequent temporal planes 312 not included in window 311. As depicted in FIG. 3B, window 311 can include a closed time boundary 313 corresponding to the earliest temporal plane, an open time boundary 315 corresponding to the latest temporal plane and two open space boundaries. The open boundaries can be reflected with imaginary detectors. In particular, imaginary detectors 319 can be temporarily added to the decoder graph to reflect open time boundary 315. Each of the added imaginary detectors can be connected to an appropriate one of the real detectors on open time boundary 315. In some embodiments, when window 311 is updated to include the next temporal plane, imaginary detectors 319 can be removed and replaced with a new set of imaginary detectors following the final temporal plane in the updated window (e.g., to reflect the open time boundary of the updated window).

Figure 3C:
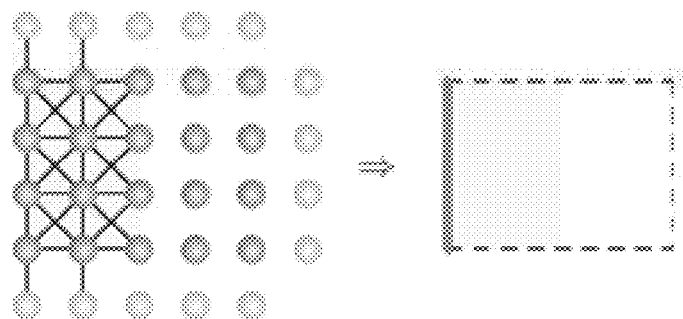
FIGS. 3C, 3D, and 3E depict additional details of decoding windows, consistent with disclosed embodiments.
Figure 3D:
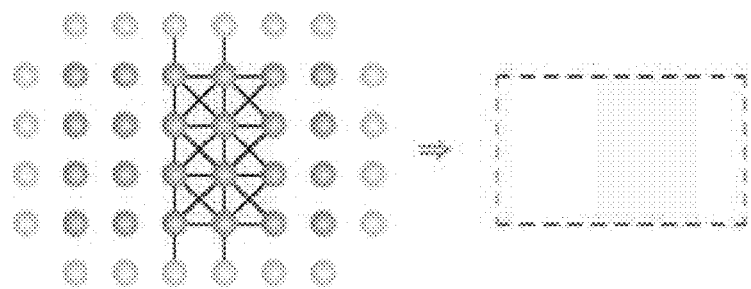
Figure 3E:
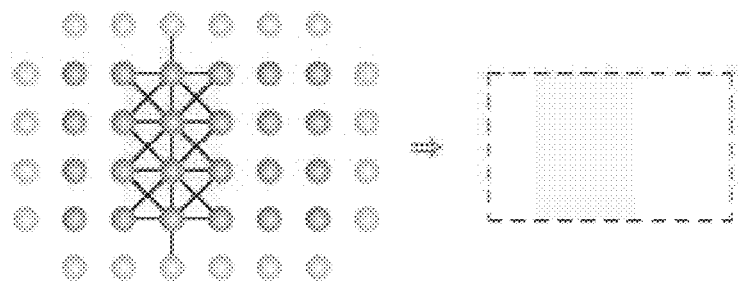

FIGS. 3C, 3D, and 3E depict additional details of decoding windows, consistent with disclosed embodiments. FIG. 3C depicts a decoding window having a closed initial time boundary and an open final time boundary. This example can correspond to a forward sliding window having a width of 5 and a step size of 2. Real detectors are depicted as solid vertices and imaginary detectors are depicted as open vertices. Edges connecting vertices are show for the core region, while edges are not depicted for the buffer region. FIG. 3C also depicts an equivalent representation in which the core region is shaded, a solid line indicates the closed temporal boundary, and broken lines indicate the remaining open space and time boundaries.

FIGS. 3D and 3E depict decoding windows having two open time boundaries. These examples can correspond to sandwich decoder windows of the first type (as described herein) having a width of 6 and a step size of 2. Each buffer region has size b=2. The decoder windows in FIGS. 3D and 3E represent valid alternative designs and the core regions across different windows in each design are disjoint edge sets. As in FIG. 3C, edges connecting vertices are show for a core region, while edges are not depicted for the two buffer regions. In these examples, the buffer regions are not symmetric. FIGS. 3D and 3E also depicts equivalent representations, similar to the equivalent representation of FIG. 3C. The equivalent representations depicted in FIGS. 3C, 3D, and 3E are used in FIGS. 4A to 4D and FIG. 5.

The following discussion will focus, for simplicity, on a quantum memory experiment. Consistent with disclosed embodiments, the application of sliding-window decoders to the quantum memory experiment can be generalized to more practical use cases of surface codes, such as lattice surgery. An approach to using a sliding-window decoder for lattice surgery is described herein.

In an existing implementation of a sliding-window decoder, the d×d×m decoding window "slides" forward one surface code cycle at a time, meaning that two adjacent windows have an overlap of m−1 surface code cycles. Accordingly, from each window, only the oldest layer of corrections output by the decoder is used. As may be appreciated, corrections for newer layers are calculated with less information about future error syndrome. Thus, corrections may improve in accuracy when more future information becomes available. Correcting each layer at the last possible moment, just before it "slides out of the window," ensures a larger amount of future information (e.g., m−1 rounds of syndromes, same as the amount of overlap between windows) is used for each correction.

However, moving forward only by a single surface code cycle at a time has a disadvantage: The total time complexity of decoding all windows. In an experiment with a total of n surface code cycles, the number of sliding windows needed is $O(n)$, and each window needs at least $O(pmd^2)$ time to decode, making the total time complexity $O(pnmd^2)$. The extra factor of $O(m)$ can severely limit the code distance that can be implemented in practice or may force an implementation to additional classical computational resource to achieve the desired throughput.

The disclosed embodiments address this problem by moving forward $s=O(m)$ surface code cycles at a time, while still preserving the same amount of overlap $l=m-s$ between windows. Importantly, when l is fixed, increasing the size of each window m will increase the step size s, and thus decrease the total time complexity (assuming a linear time complexity for the underlying decoder). For example, if s=l and m=2l, then the total time complexity becomes:

$$O(pmd^2)\cdot O\!\left(\frac{n}{s}\right) = O(pld^2)\cdot O\!\left(\frac{n}{l}\right) = O(pnd^2)$$

Thus, preserving the overlap results in a constant overhead, as compared to the batch decoder.

As may be appreciated a decoder can be configured to neutralize all detection events, as opposed to finding a "correct" error assignment at each individual location. A "correct" error assignment may not be unique. Any two set of corrections that differ by one or more stabilizers can be logically equivalent. This fact can pose a challenge for sliding-window decoders. Each decoder window may determine a set of (physical) corrections that is individually "correct." However, combining these sets of corrections into a consistent, overall set of corrections for the entire decoder graph may be impracticable. A naive method—simply taking a subset of edges from each decoder window—may result in inconsistencies along a boundary separating decoder windows, such as un-neutralized detection events after applying the corrections. Such detection events may even be newly created by applying the corrections.

As may be appreciated, when inconsistencies between corrections exist, the result of a logical measurement may not be well-defined and may depend on the logical operator representative chosen. Furthermore, no matter which logical operator representative is chosen, the possibility that a low-weight error will cause a logical error cannot be excluded. As may be appreciated, two adjacent windows may disagree on where an error should be corrected, causing it to be corrected 0 or 2 times.

In an existing sliding window implementation, a closed past time boundary for each decoding window, together with a syndrome update process, is used to ensure that each window cooperates with the previous window to neutralize all detection events on the boundary. The oldest layer of corrections from the previous window can be applied before the current window receives the input, which consists of a set of detection events that may have already been modified by the previous window. And since the past time boundary is closed, a window can only send a detection event "into the future," not "back to the past." Conversely, the syndrome update process enables use of a closed past time boundary, since the updated syndrome contains information passed down from all the previous windows, so it is unlikely that a detection event on the past time boundary can be explained away as a time-like error in the past of the current window.

Disclosed embodiments can generalize this syndrome update scheme to a step size of s>1. Since syndromes are constantly being passed forward, this approach is referred to herein as the forward-window approach. In some embodiments, the forward-window approach can necessitate a strict data dependency between decoding of the windows. For example, decoding of one window may finish before decoding of the next window can start. For sliding-window decoders, throughput may theoretically be increased by exploiting parallelism between windows, but such efficiencies cannot be realized with forward-window decoders, as the strict data dependency causes the critical path to run through all windows.

FIGS. 4A to 4D depict a forward window approach to sliding window decoders, consistent with disclosed embodiments. Each window includes detectors $\delta_{1+ks}^Z$ to $\delta_{w+ks}^Z$ for k from 0 to 3. Within each window (starting from the first window, k=0) the inner decoder first finds a set of corrections that can annihilate the existing defects. But the decoder only retains the corrections in the core region. If the current window is the final one, all observed defects will have been annihilated and the decoder will terminate. FIG. 4A depicts an initial window. The earlier time boundary is closed, the later time boundary is open, and the space boundaries are open. The window includes detectors $\delta_1^Z$ to $\delta_w^Z$, where w is the width of the window. The window includes a core region 410 and a buffer region 420 (that includes temporal plane(s) that overlap with a core region of a subsequent region). Core region 410 can include the set of edges in the window that are incident to at least one detector in the planes $\delta_1^Z$ to $\delta_s^Z$, where s is the step size. Buffer region 420 can include the remaining edges in the window. Certain detectors in the window, such as detector fault 411, have a value that indicates a fault (e.g., the value one as opposed to zero). The inner decoder can identify a set of edges that annihilate the detector faults. This set of edges can include edges connected to imaginary detectors (e.g., imaginary detector 430). However, the decoder only retains the edges in core region 410. FIG. 4B depicts the next window. The detectors on initial time boundary (e.g., $\delta_{1+s}^Z$) are updated to reflect the corrections in core region 411. This creates a detector fault (e.g., created detector fault 431). The inner decoder then identifies a set of edges that annihilate the detector faults and but retains only the edges in the core region. FIG. 4C depicts the next window. The detectors on initial time boundary (e.g., $\delta_{1+2s}^Z$) are updated, creating a detector fault (e.g., created detector fault 441). The inner decoder then identifies a set of edges that annihilate the detector faults and but retains only the edges in the core region. FIG. 4D depicts the final window. The entirety of this window constitutes the core region. The inner decoder then identifies a set of edges that annihilate the detector faults and retains the edges in the window. In some embodiments, the set of all corrections retained in all windows can be the output of the decoder.

Intuitively, the corrections found in the core become more reliable with larger buffer regions, as the future faults outside the window are less likely to affect the core region. A window needs no buffer preceding the core region because all past defects have been reliably annihilated, rendering the past time boundary of the window closed.

The disclosed embodiments can implement an alternative approach to sliding-window decoders. This approach enables adequate window overlap and addresses the correction consistency problem described herein. Furthermore, this approach can enable parallelism between windows. In some embodiments, this approach can provide a much shorter critical path that does not increase with the total number of windows.

The forward-window approach can solve the correction consistency problem by combining an open time boundary with a closed time boundary, and propagating boundary syndromes from the former window to the time boundary of the latter window. In the forward-window approach, this is only done in the forward direction, which causes a long critical path.

In some embodiments, boundary syndromes can be propagated in the backward direction from an open time boundary to a closed time boundary. By alternating forward propagation with backward propagation, the length of the critical path (in terms of windows) can be made constant:

A first window type, which have open time boundaries on both sides (or open time boundaries on one side, for the first and last windows) and do not depend on any other windows.

A second window type (also referred to as boundaries), which have closed time boundaries on both sides and only depend on the windows of the first type.

This approach is referred to herein as the sandwich-window approach since each window of the second type is "sandwiched" between two windows of the first type.

Figure 5:
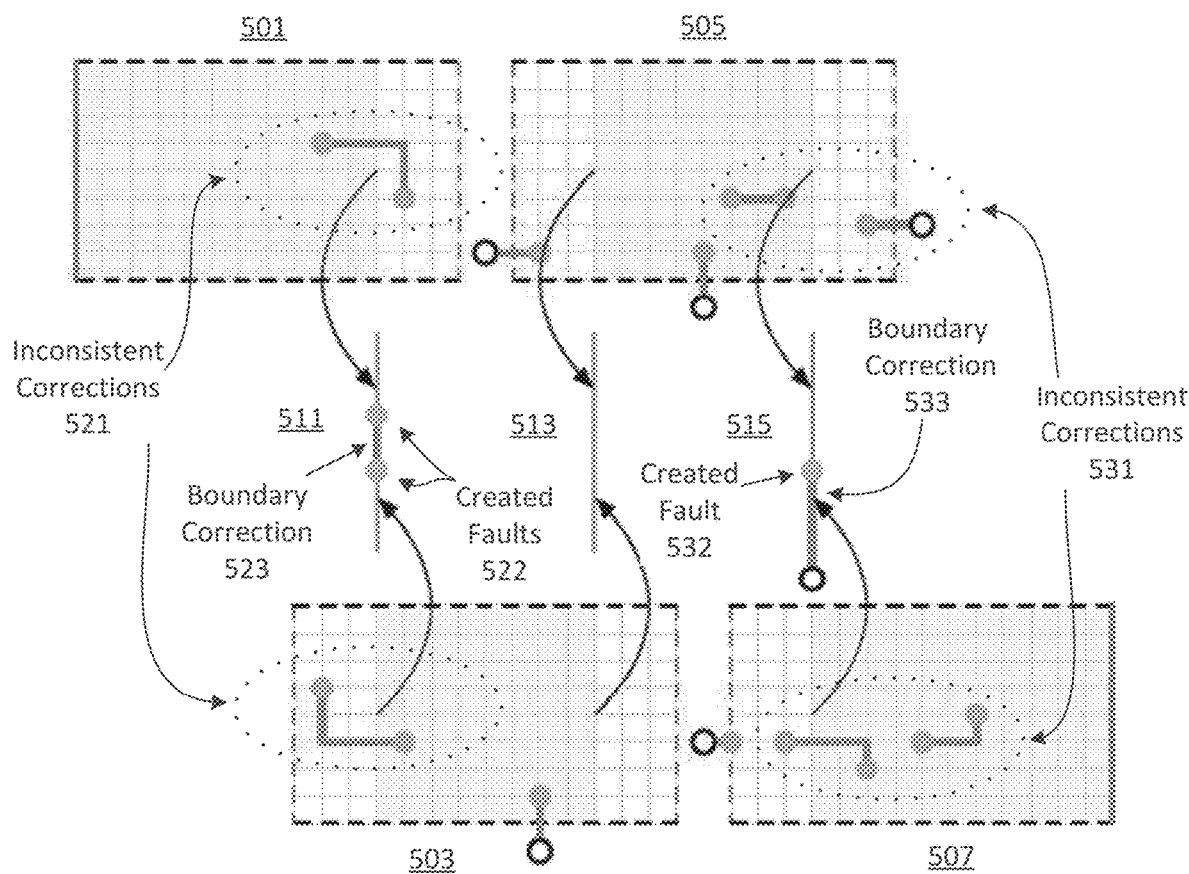
FIG. 5 depicts sandwich decoding using seven windows, consistent with disclosed embodiments.

FIG. 5 depicts sandwich decoding using seven windows, consistent with disclosed embodiments. The seven windows include four windows of the first window type. Window 501, the first window, has a closed time boundary (at the initial time) and an open time boundary. Window 501 includes a core region and a buffer region that overlaps with window 503. Window 507 has an open time boundary and a closed time boundary (at the final time). Window 507 includes a core region and a buffer region that overlaps with window 505. Windows 505 and 503 have open time boundaries. Window 505 includes a core region, a buffer region that overlaps with window 507, and a buffer region that overlaps with window 503. Window 503 includes a core region, a buffer region that overlaps with window 505, and a buffer region that overlaps with window 501. In this example, the seven windows also include three windows of the second type (e.g., windows 511, 513, 515).

As depicted in FIG. 5, different windows have access to different fault information. A decoder can determine, for each window, a set of corrections that annihilate the faults on that window. Accordingly, decoders can determine sets of corrections that are inconsistent between windows. In this example, the sets of corrections for windows 505 and 507 are inconsistent (e.g., inconsistent corrections 531). Similarly, the sets of corrections for windows 501 and 503 are inconsistent (e.g., inconsistent corrections 521). As described herein, corrections in core regions are retained, and closed temporal boundaries are updated with created faults to reflect these corrections. Accordingly, the inconsistent corrections result in created faults in window 511 (e.g., created faults 522) and window 515 (e.g., created fault 532). The decoders for the windows of the second type can be configured to address these created faults, just as they would any other fault present in the window. For example, the decoder for window 511 can identify boundary correction 523 as annihilating created faults 522 and boundary correction 533 as annihilating created fault 532. As may be noted, boundary correction 533 connects to an imaginary detector. In general, a boundary correction can be determined because the space edges of the decoder windows are open.

Figure 6:
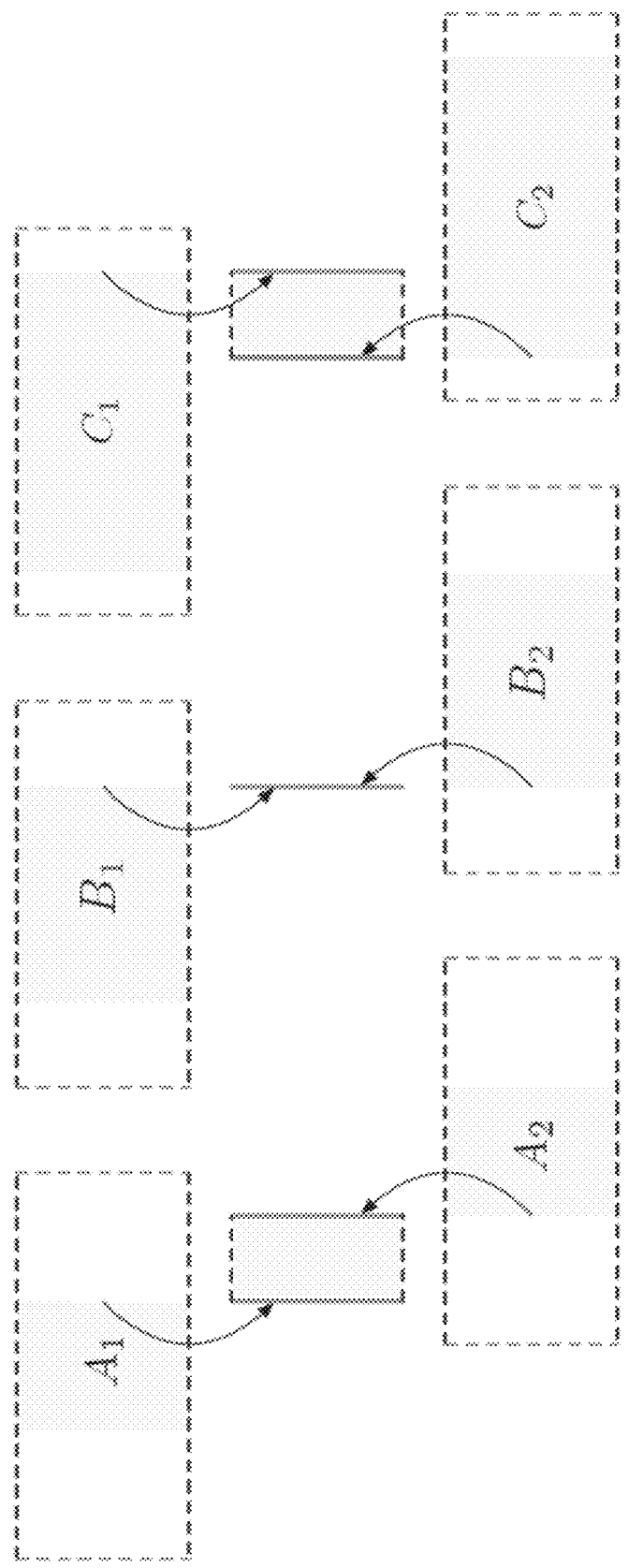
FIGS. 6A to 6C depict windows of the second type having varying degrees of overlap, consistent with disclosed embodiments.

In this example, the windows of the second type each having a window size of 1. This configuration choices causes them to degenerate into 2D decoder graphs. As may be appreciated, this depiction is not intended to be limiting. In some embodiments, windows of the second type need not overlap with adjacent windows since such windows already get "context information" from boundary syndromes propagated to them on both sides. For example, FIGS. 6A to 6C depict windows of the second type having varying degrees of overlap. In FIG. 6A, the core regions do not have any overlap. The type two window thus includes detectors that are in neither of the non-overlapping type one windows. The decoder identifies corrections that annihilate any faults in the window, including created faults present in the closed temporal boundaries of the type two window. In FIG. 6B, the core regions meet. The type two window is a two-dimensional decoder graph, as depicted in FIG. 5. In FIG. 6C, the core regions overlap. As may be appreciated, the corrections determined in the core regions of each type one window may be retained. Thus, the only faults present in the type two window may be created faults on the temporal boundaries of the window. The decoder can determine corrections for these created faults. In each case, the overall set of corrections can include the corrections from both type one windows and the type two window.

Figure 7:
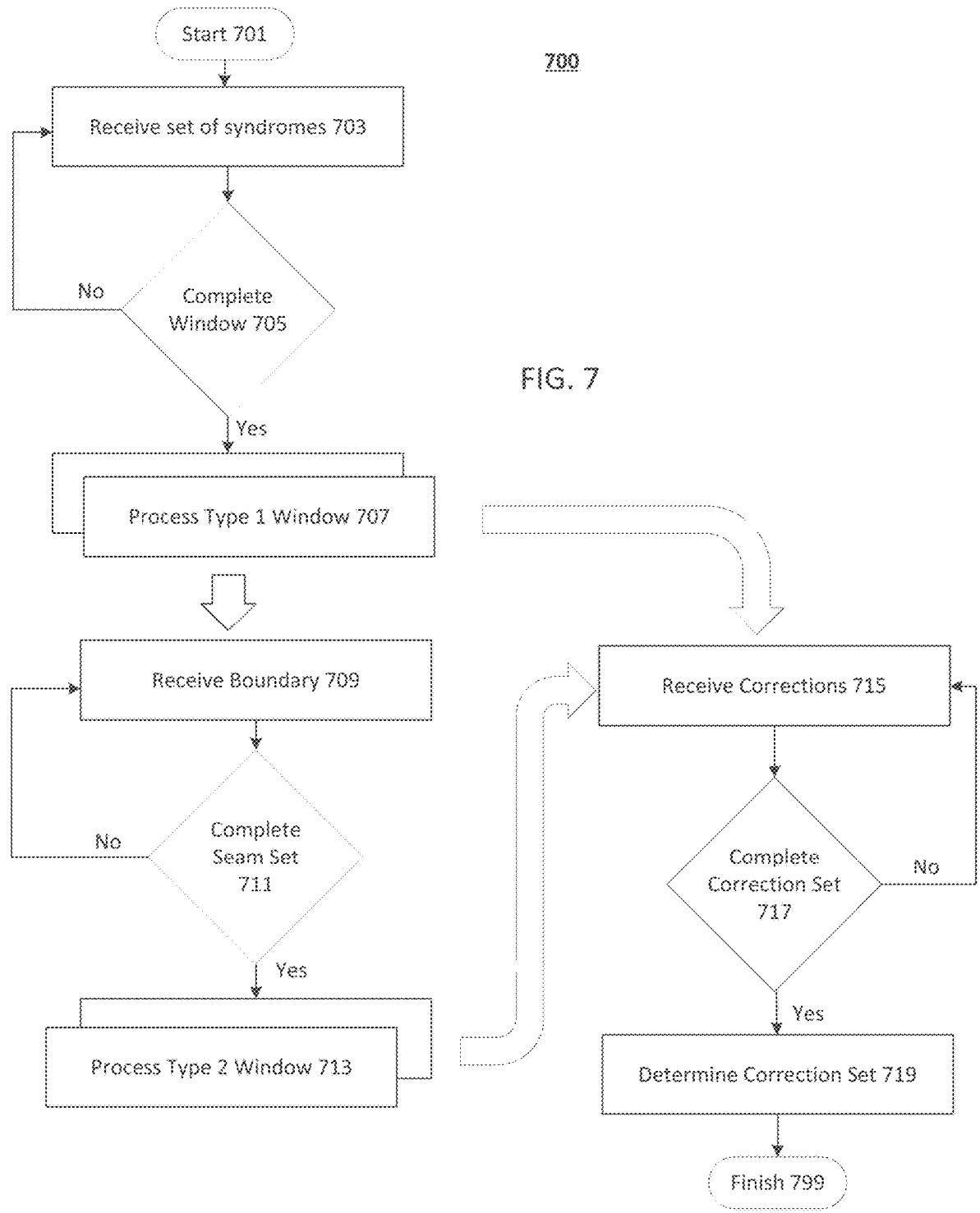
FIG. 7 depicts an exemplary decoding process 700 using a sandwich sliding window decoder, in accordance with disclosed embodiments.

FIG. 7 depicts an exemplary decoding process 700 using a sandwich sliding window decoder, in accordance with disclosed embodiments. Decoding process 700 can be performed by a classical computing system, such as a laptop, desktop, workstation, computing cluster, application running on a cloud-computing platform, or any combination of the forgoing. Decoding process 700 can be performed as an online process. For example, decoding process 700 can be performed while a quantum memory experiment is being performed. Decoding process 700 can include different tasks (e.g., processing a type one window, processing a type two window, combining corrections from different windows, or the like). The classical computing system can perform these different tasks using different threads, cores, processing units, or any combination of the foregoing. Certain tasks can be performed at least partially in parallel. For example, the classical computing system can process multiple type one windows at the same time using different threads, cores, or processing units. Similarly, the classical computing system can process type one windows and type two windows at the same time using different threads, cores, or processing units (so long as the preconditions for the type two windows have been satisfied.

In step 701, process 700 can start. In some embodiments, process 700 can be performed as part of another process. For example, process 700 can be performed as a QEC component of a quantum computation performed using a surface code. In some embodiments, process 700 can be performed as a stand-alone process. For example, a quantum memory experiment using process 700 can be performed during characterization or benchmarking of a surface code implementation. In some embodiments, step 701 can include obtaining parameters governing the decoding. Such parameters can include window width and overlap, inner decoder type, and the like. Such parameters can be obtained from a user of the classical computing system, from another system or memory accessible to the classical computing system, can be specified in a configuration file or default setting, or some combination of the foregoing, or the like.

In step 703 of process 700, the classical computing system can receive a set of syndromes from a quantum processing unit, consistent with disclosed embodiments. The classical computing system can receive the syndromes directly from the quantum processing unit, or indirectly through one or more other computing systems. In some instances, the set of syndromes can correspond to a cycle of syndrome extraction (e.g., performance of the check operations depicted in FIGS. 1B and 1C on the X-type and Z-type ancillary qubits in the surface code). In some instances, receiving the set of syndromes can include receiving final measurements of data bits and extracting Z-type syndromes for the ancillary qubits from the measurements of the data bits.

In some embodiments, the classical computing system can use the set of syndromes to generate a corresponding set of detectors, as described herein. For example, the first set of syndromes can generate the detectors $\delta_1^Z$, the second set of syndromes can generate the detectors $\delta_2^Z$ and $\delta_2^X$, and the final set of measurements can be used to generate the set of detectors $\delta_{n+1}^Z$, where n is the number of cycles. The classical computing system can add the generated detectors to an accumulated set of detectors.

In step 705 of process 700, the classical computing system can determine whether the accumulated set of detectors constitutes a complete decoder window, consistent with disclosed embodiments. In some instances, a complete decoder window can include a predetermined number of cycles of detectors (e.g., in accordance with parameters obtained in step 701). For example, as shown in FIG. 3D, a decoder window may include 7 cycles of detectors. In some instances, the final decoder window may include a differing number of cycles (e.g., when the quantum memory experiment includes 10 cycles of syndrome measurement, one data measurement, and the window size is 3). In such instances, the classical computing system can determine that the accumulated set of detectors includes a complete decoder window when the classical computing system obtains the final set of detectors.

When the classical computing system has obtained a complete decoder window, process 700 can proceed to step 707. Otherwise, process 700 can return to step 703 to await receipt of additional syndromes.

In step 707 of process 700, the classical computing system can process the accumulated set of detectors as a type one window, consistent with disclosed embodiments. In some embodiments, the classical computing system can perform step 707 using a thread, core, or processing unit separate from the thread, core, or processing unit(s) that performed steps 703 or 705. For example, a thread performing steps 703 and step 705 can start a new thread to perform step 707 using the accumulated set of detectors. In some instances, as depicted in FIG. 7, performance of step 707 can be at least in part parallelized. Multiple instances of step 707 can be performed on multiple decoder windows at the same time.

In some embodiments, processing the accumulated set of detectors can include determining a set of corrections that annihilates any faults within the decoder window, as described with regards to FIG. 5. The set of corrections can be determined using an inner decoder. The disclosed embodiments are not limited to a particular formulation of inner decoder. In some embodiments, the inner decoder can be or include a union-find decoder. The union-find decoder can be a weighted growth union find decoder. In some embodiments, the inner decoder can be or include a minimum-weight perfect matching decoder.

Consistent with disclosed embodiments, the output of step 707 can be a set of corrections and sets of core region boundary values (e.g., a left boundary and a right boundary). The set of corrections can include those corrections within a core region of the decoder window. As may be appreciated, the first and last type one decoder windows can include a core region and one buffer region, while the other type one decoder windows can include a core region and two buffer regions. The boundaries can include the detector values of detectors on the boundary of the core region after application of the corrections within the core region. As may be appreciated, the boundaries can include created detector faults, as depicted in FIG. 5.

In some embodiments, upon completion of the processing of the type one window, the thread can terminate, or the core or processing unit can become available for processing other windows.

In step 709 of process 700, the classical computing system can receive a boundary generated in step 707, consistent with disclosed embodiments. As may be appreciated, the thread, core, or processing unit receiving each boundary can differ from the thread, core, or processing unit processing the type one window. For example, a first thread tasked with processing the type one window can identify a second thread tasked with processing the left boundary. The first thread can make the left boundary available to the second thread (e.g., through a suitable method of inter-thread communication). The first thread can start a new, third thread and task the third thread with processing the right boundary. As an additional example, a first thread can determine whether another thread tasked with processing the right (or left) boundary exists. If so, the first thread can provide the right (or left) boundary to the other thread. Otherwise, the first thread can cause the classical computing system to create a suitable thread for processing the left (or right) boundary.

In some embodiments, when the type two windows include multiple cycles of detectors (e.g., as depicted in FIGS. 6A and 6C), the thread, core, or processing unit can obtain the appropriate set of detectors (e.g., from another thread, core, or processing unit, from a memory or another system, or the like).

In step 711 of process 700, the classical computing system can determine whether a complete set of boundaries has been obtained, consistent with disclosed embodiments. If so, process 700 can proceed to step 713. Otherwise, process 700 can return to step 709 to await the other boundary.

In step 713 of process 700, the classical computing system can process a type two window using the boundaries (and in some embodiments the multiple cycles of detectors) obtained in step 709, consistent with disclosed embodiments. In some embodiments, the boundaries can be combined (e.g., XORed) to generate an updated boundary. As may be appreciated, when two overlapping type one windows have a consistent set of corrections, the boundaries for the windows will include matching created faults. Combining the boundaries will annihilate these created faults. When two overlapping type one windows have inconsistent corrections, the boundaries for the windows will include dissimilar created faults (or an odd number of faults). The combined boundary will then include created fault(s). The classical computing system can then apply an inner detector (which may or may not be the same inner detector as in step 707) to determine a set of corrections that annihilates any faults present in the type two window. In some embodiments, upon completion of the processing of the type two window, the thread can terminate, or the core or processing unit can become available for processing other windows. In some instances, as depicted in FIG. 7, performance of step 713 can be at least in part parallelized. Multiple instances of step 713 can be performed on multiple type two windows at the same time.

In step 715 of process 700, the classical computing system can receive the corrections generated in steps 707 and 713. As may be appreciated, the thread, core, or processing unit receiving such corrections can differ from the thread(s), core(s), or processing unit(s) generating such corrections. For example, a first thread tasked with processing the type one window can identify a second thread tasked with determining an overall set of corrections. The first thread can make a set of corrections available to the second thread (e.g., through a suitable method of inter-thread communication). As an additional example, a first thread can determine whether another thread tasked with determining the overall set of corrections exists. If so, the first thread can provide the set of corrections to the other thread. Otherwise, the first thread can cause the classical computing system to create a suitable thread for determining the set of corrections.

In step 717 of process 700, the classical computing system can determine whether a complete correction set has been received, consistent with disclosed embodiments. In some embodiments, a complete correction set can include the core region corrections for all type one windows and the boundary (and in some instances core region) corrections for all type two windows. If a complete correction set has been received, process 700 can proceed to step 719, otherwise process 700 can return to step 715 to await receipt of additional corrections.

In step 719 of process 700, the classical computing system can determine the correction set. In some embodiments, the correction set can be the combination of the correction sets for the core regions of the type one windows and the correction sets for the boundaries (and in some instances core regions) of the type two windows. For example, the correction set can be the XOR of the correction sets for the type one windows and the type two windows. For example, if an edge is included in an even number of correction sets, the edge is not included in the combined correction set. If the edge is included in an odd number of correction sets, the edge is included in the final correction set.

In step 799, process 700 can terminate. In some embodiments, the determined correction set can be output to a user or another system. For example, an indication of the determined correction set can be displayed to a user in a graphical user interface or otherwise provided to the user. When process 700 is performed as a component of a larger process, the determined correction set can be used in the performance of another step in that process. For example, The disclosed embodiments are not limited to using a particular decoder as the inner decoder that decodes each individual window. Furthermore, the inner decoder can be implemented in any suitable computing language (e.g., Python, C, or another suitable language).

In some embodiments, the inner decoder can be a union-find (UF) decoder. In some embodiments, such a union-find decoder can be a weighted growth UF decoder. As may be appreciated, the UF decoder exhibits a low time complexity both in theory and in practice. However, the UF decoder does not approximate the minimum-weight correction, or indeed any "likely" correction; instead, it tries to find an equivalence class that is likely to contain the actual error, and then chooses an arbitrary correction in that equivalence class with a simple peeling decoder. This means that "boundary syndromes" given by applying only part of the correction output by the UF decoder may be misleading. In some embodiments, the inner decoder can be a minimum-weight perfect matching (MWPM) decoder.

Simulations consistent with disclosed embodiments were performed for a variety of configurations. Given each code distance d $G \in \{3, 5, \ldots, 17\}$, a sandwich decoder was selected with step size $s_d=(d+1)/2$ and window $w_d=3s_d$. We use the 3D MWPM and UF decoder respectively as the inner decoder to handle each type-1 window and the 2D MWPM and UF decoder respectively to handle each type-2 window (i.e., the boundary offset was 0).

For the experiments with the UF inner decoder, physical error rates $p \in \{0.3\%, 0.4\%, 0.5\%, 0.55\%, 0.6\%, 0.7\%, 0.8\%\}$ were considered; for the experiments with the MWPM inner decoder, physical error rates $p \in \{0.4\%, 0.5\%, 0.6\%, 0.65\%, 0.7\%, 0.8\%\}$ were considered. For each physical error rate p, a Monte Carlo simulation was performed to find the logical error rate per d cycles for 100; 000 shots. An estimated threshold of 0:55% was obtained for the UF sandwich decoder as shown in FIG. 8C. The same experiments were performed using UF batch decoders and similar threshold obtained as shown in FIG. 8D. The thresholds for the MWPM sandwich decoder and batch decoder are 0:68% in FIG. 8A and 0.70% in FIG. 8B.

To define the concept of "the logical error rate per d cycles" $p_L(d)$, each cycle of syndrome extraction is assumed to independently flip the logical qubit with a fixed probability $p_L(1)$. If we exclude the data qubits initialization and final measurement faults, the probability of flipping the logical qubit after i cycles of syndrome extraction $p_L(i)$ satisfies:

$$1-2p_L(i)=(1-2p_L(1))^i$$

If q is defined to be the probability that the data qubit initialization and measurement collectively flip the logical qubit, then the probability $P_{L,n}$ of logical error for an n-cycle memory experiment satisfies:

$$1-2p_{L,n}=(1-2q)\cdot(1-2p_L(1))^n$$

The logical error rate per d cycles $p_L(d)$ can therefore be calculated from the estimated logical error rate per shot $\hat{p}_{L,n}$ using the weighted least squares estimator:

$$\log(1-2\hat{p}_L(d)) = x^T \text{diag}(w) y / x^T \text{diag}(w) x$$

where $$x_n = (n-\bar{n})/d,$$

$$w_n = 1/\hat{\text{Var}}(y_n),$$

$$y_n = \log(1-2\hat{p}_{L,n}) - \overline{\log(1-2\hat{p}_{L,n})}.$$

The explicit form of the estimator $\hat{\text{Var}}(y_n)$ is described herein. In our experiments, different overall numbers of cycles $n=\lfloor ks_d/2 \rfloor$ were simulated, where $k \in \{8,9,\ldots,20\}$.

To more efficiently simulate the behavior of our scheme for different numbers of cycles, simulation experiments were conducted simultaneously, reusing the sampled errors and decoder outputs for early cycles. That is, for each d and p, one decoder graph was constructed with $n=10s_d$ and sample errors on it. Then, within the same decoder graph, we calculate the logical error rates per shot for all $n=\lfloor ks_d/2 \rfloor$ where $k \in \{8,9,\ldots,20\}$. This causes the results of those experiments to be correlated, but over the 100; 000 independent shots, the effect of this correlation should be minor. More specifically, each simulation proceeds as follows:
1. Before starting any sliding, sample edges on the entire decoder graph according to pre-calculated probabilities, except for the final data qubit measurement errors.
2. Decode each type-1 window with defects generated from the sampled edges and identify the core region. More specifically, (a) when the window has reached the last cycle (i.e., the last layer in the decoder graph), sample edges resulted from final data qubit measurement errors, decode window, and apply corrections in the core region. Finally, calculate the logical error rate per d cycles; (b) when the window has not reached the last cycle but would be the last window if the number of cycles equals $\lfloor ks_d/2 \rfloor$ where $k \in \{8,9,\ldots,19\}$, make two copies of the current situations. On one copy, treat this window as the last window in case (a). On the other copy, proceed as in case (c); (c) when the window is not the last window for any numbers of cycles requested, decode, apply correction in the core region, and slide to the next window.
3. For each type-2 window (i.e., the overlapping boundary between two consecutive decoded type-1 windows), put all inconsistent detectors into a 2D decoder and apply all the generated corrections.

For each value of n (and combination of other parameters), our Monte Carlo simulation gives an estimated logical error rate per shot $\hat{p}_{L,n}$ with variance:

$$\text{Var}(\hat{p}_{L,n}) = \frac{p_{L,n} \cdot (1-p_{L,n})}{N}$$

where $N=10^5$ denotes the number of shots. The weights $w_i$ used in the least squares estimator are derived from the approximate variance:

$$\hat{\text{Var}}(y_n) = \hat{\text{Var}}(\log(1-2\hat{p}_{L,n})) \approx \left(\frac{2}{(2\hat{p}_{L,n}-1)}\right)^2 \cdot \hat{\text{Var}}(\hat{p}_{L,n})$$

As described herein, the estimations $\hat{p}_{L,n}$ for different values of n are correlated. Therefore, the user variance estimator for least squares cannot be used. Instead, a conservative estimate of the variance can be:

$$\hat{\text{Var}}(\log(1-2\hat{p}_L(d))) \lesssim \left(\sum_n |x_n| w_n \sqrt{\hat{\text{Var}}(y_n)} \Big/ \sum_n w_n x_n^2 \right)^2$$

logical error rate per cycle can therefore be calculated from the logical error rate per shot.

Figure 8A:
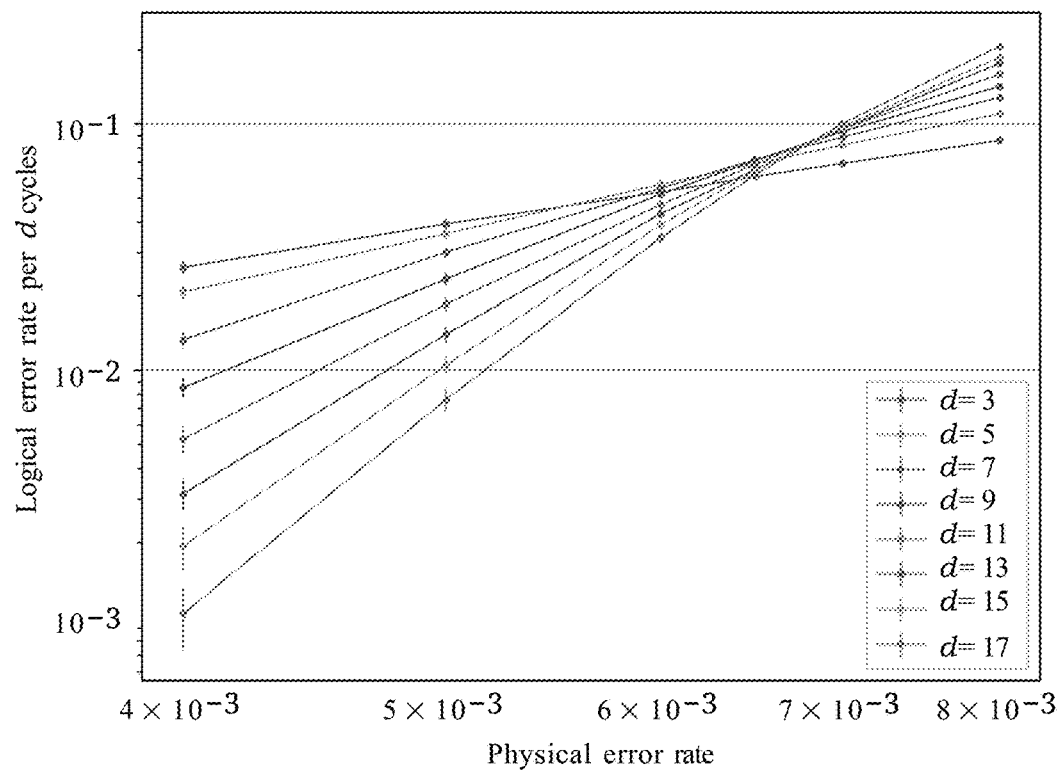
FIGS. 8A to 8D depict exemplary logical error rates as a function of physical error rates for different code distances for MWPM sandwich and batch decoders and UF sandwich and batch decoders, consistent with disclosed embodiments.
Figure 8B:
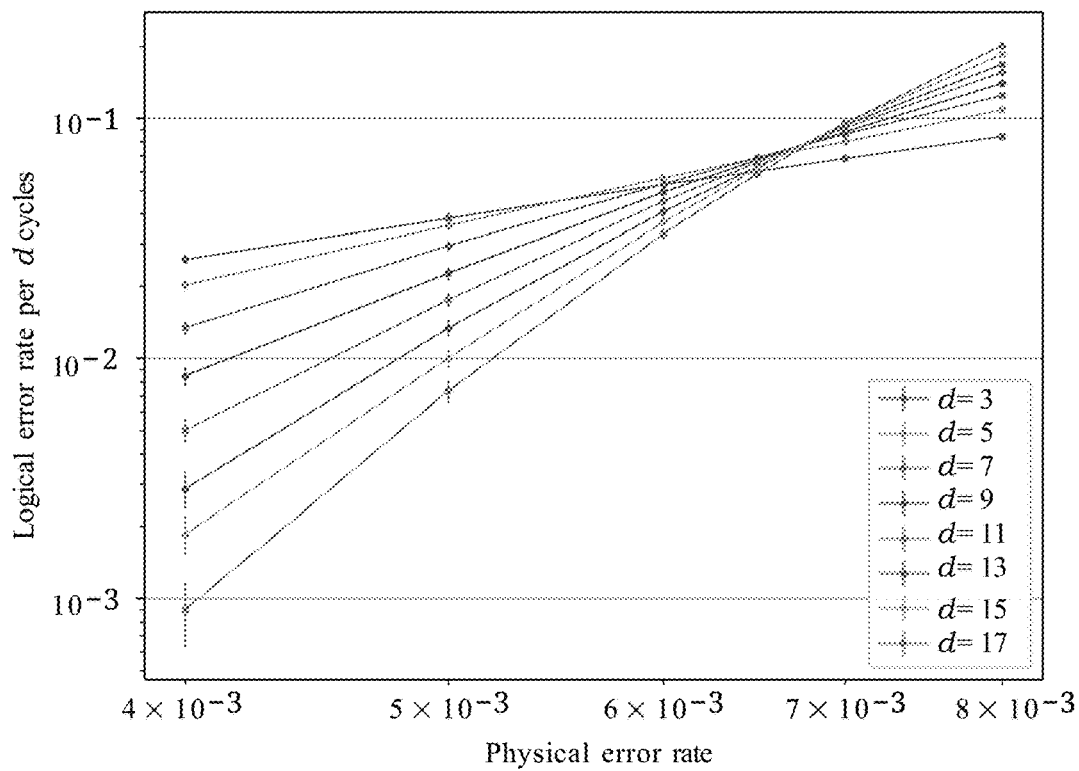
Figure 8C:
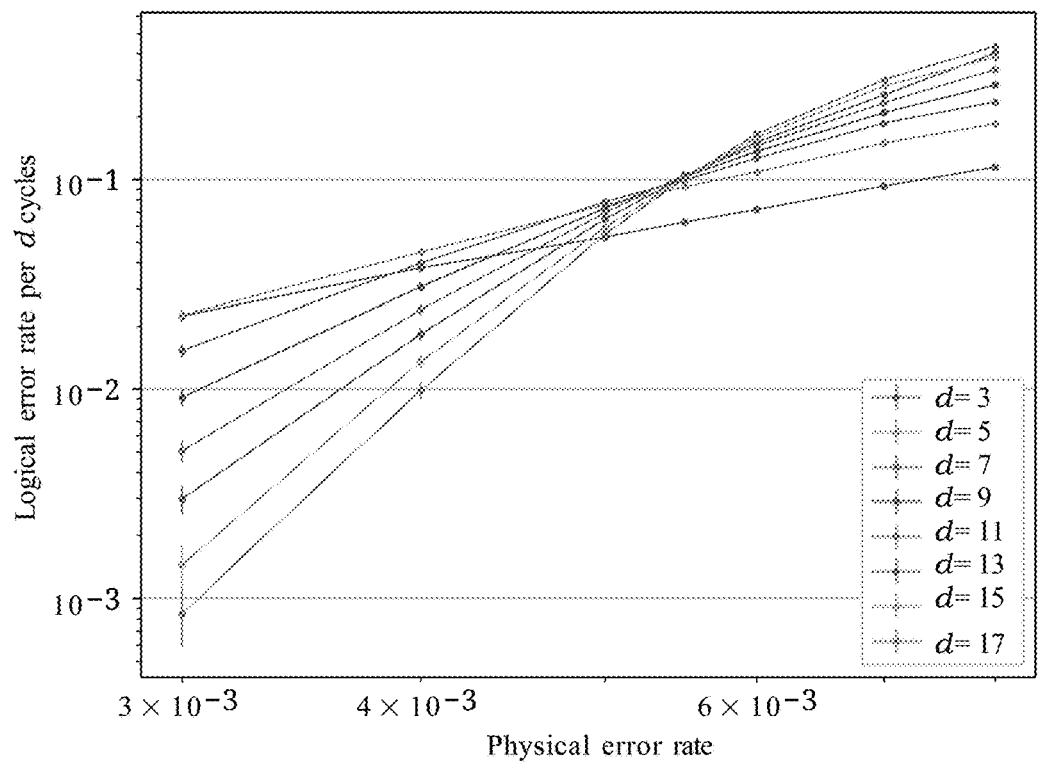
Figure 8D:
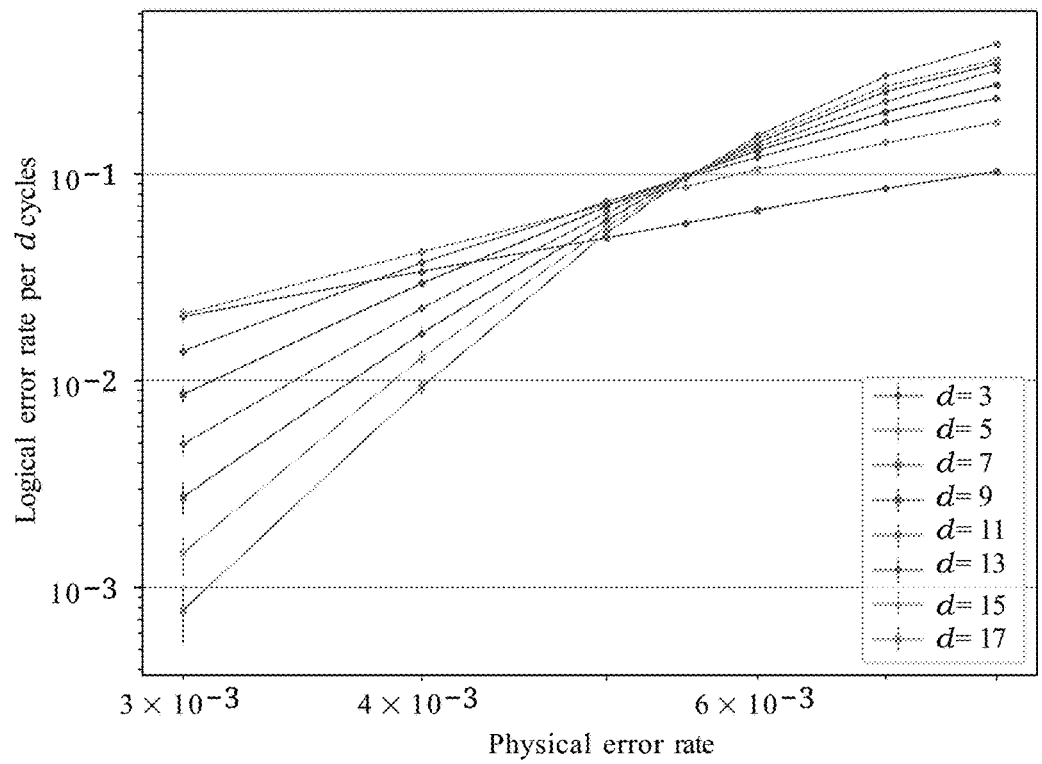

FIGS. 8A and 8B depict exemplary decoder error rates for the MWPM sandwich decoder and batch decoder, respectively. FIGS. 8C and 8D depict exemplary decoder error rates the UF sandwich window and batch decoder, consistent with disclosed embodiments, respectively. Logical error rates are plotted against physical error rates for surface codes of varying depth. All $p_L^d$ values for different numbers of cycles are plotted for each physical error rate. The plotted line for each distance d connects through the average values of all $p_L^d$. For both inner decoders, the sandwich sliding window decoder has similar performance to the corresponding batch decoder.

Sampling errors were investigated using circuit-level depolarizing noise model with a single parameter p. Preparation and measurement errors were assumed to exist on all data and ancilla qubits, where a qubit is initialized to an orthogonal state with probability p and a measurement result is flipped with probability p. Each single-qubit, two-qubit, and idle gate was implemented as a perfect gate followed by a depolarizing channel. With probability p, the perfect gate was afflicted by a non-trivial Pauli error chosen uniformly at random. The errors attached to different elementary operations were applied independently.

Each sandwich window was associated with a range such that only corrections (which are edges) that fall into this range are applied (e.g., the core region of FIGS. 3C to 3E). For a general window that was neither the first nor the last one, the range was the middle $s_d$ layers in the current window and both time-boundaries are open. The top and bottom layers in this range of corrections are called the upper and lower boundaries. The upper boundary of the current window coincides with the lower boundary of the next window, so that the inconsistencies between two windows can be addressed using a 2D decoder.

For the first window, not only should the decoder correct the middle sa layers, but also all the layers precedent to them, as the lower time-boundary is closed for the first window. Similarly, the last window corrects the middle $s_d$ layers as well as all the layers after them, as the upper time-boundary is closed for the last window.

When the performance of sandwich sliding window decoders is evaluated, the step size and window size are two natural features to consider:

window size (w)=step size (s)+2×overlap (o)

As the number of cycles increases, the logical error rate per shot also increases and gradually converges to 0.5.

Figure 9A:
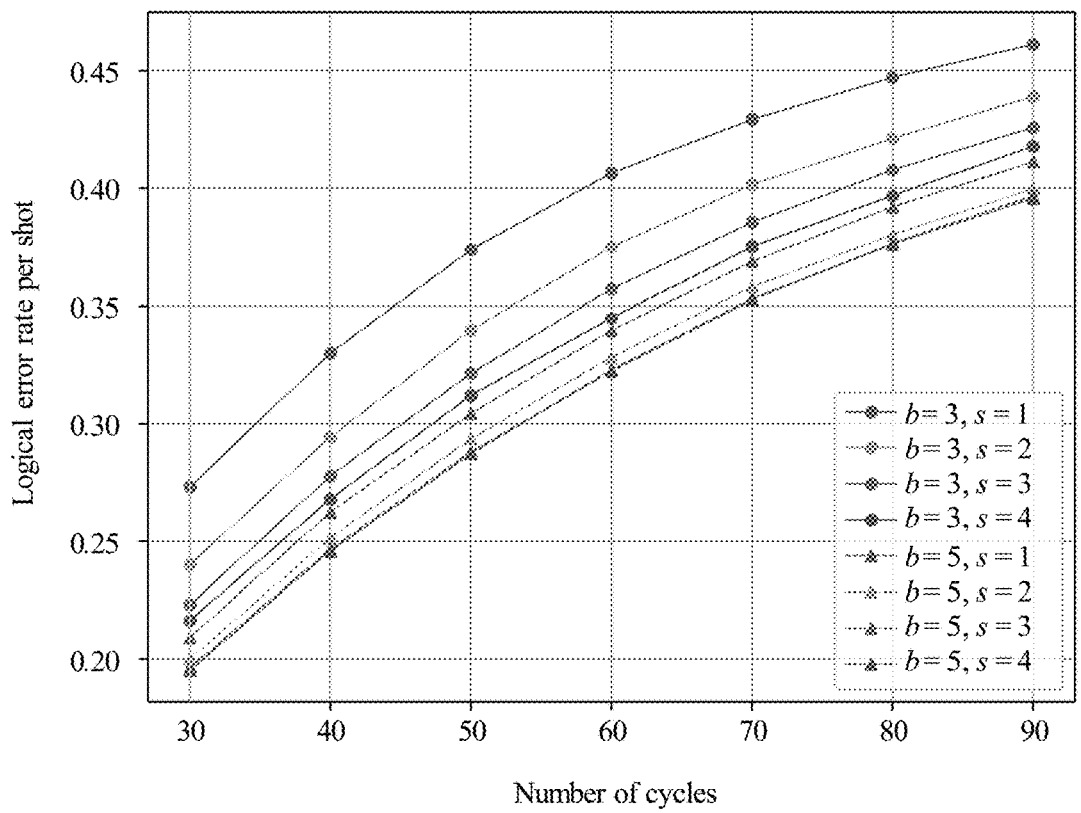
FIGS. 9A and 9B depict the dependence of logical error rate per shot and per d of cycle on step size and overlap, consistent with disclosed embodiments.
Figure 9B:
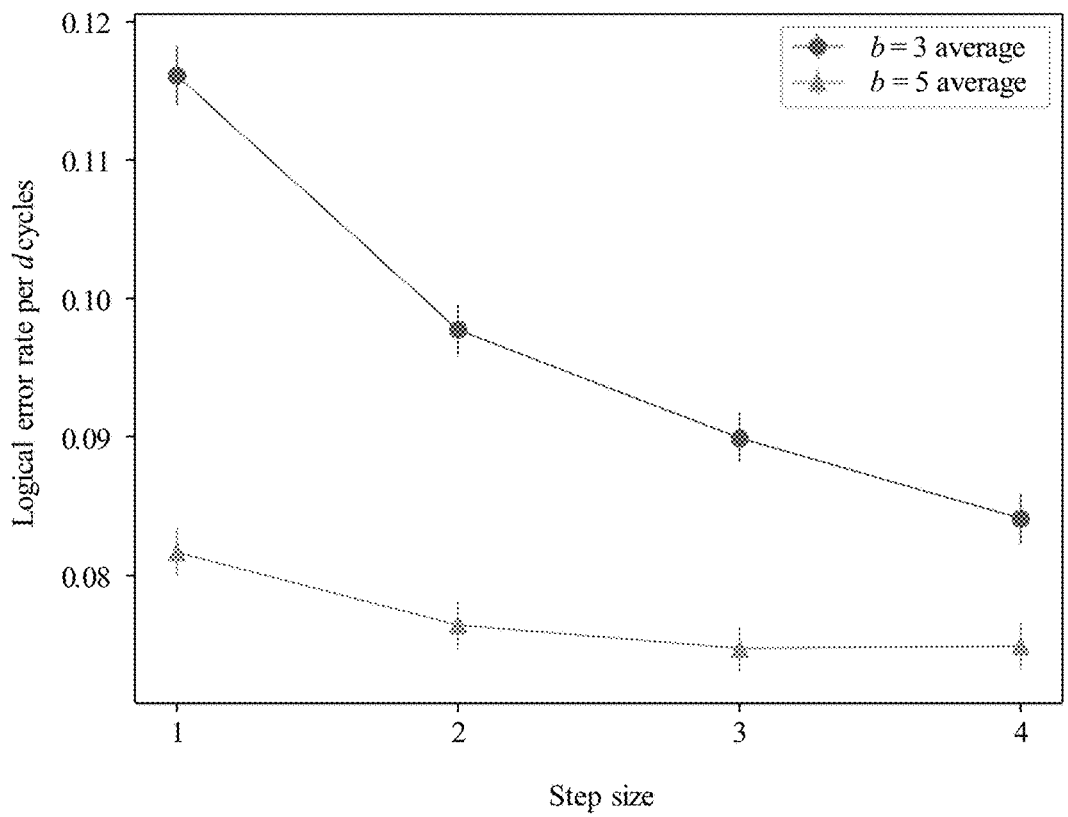

FIGS. 9A and 9B depict the dependence of logical error rate per shot (FIG. 9A) and per d of cycle (FIG. 9B) on step size and overlap when d=9 and p=0.005, window size is s+2b, and the number of cycles is 30 to 90, consistent with disclosed embodiments. Larger step size and overlap generally resulted in lower logical error rates. In FIG. 9A, the overlap was fixed to 3 and 5 and step size varied. In FIG. 9B, logical error rates per shot were converted to logical error rates per d cycles as a function of overlap. Each transparent point was calculated from one of the numbers of cycles. Each concrete point is the average of all 7 transparent points.

During each sandwich window the decoder is given information of detection events from both the future and the past as corrections are accepted in the middle. Consistent with disclosed embodiments, a forward window approach can prevent premature matchings by taking account into the most recent future detection events. However, a forward window approach fails to prevent problematic matchings from the past because the decoder is unaware of its most recent past events.

Figure 10A:
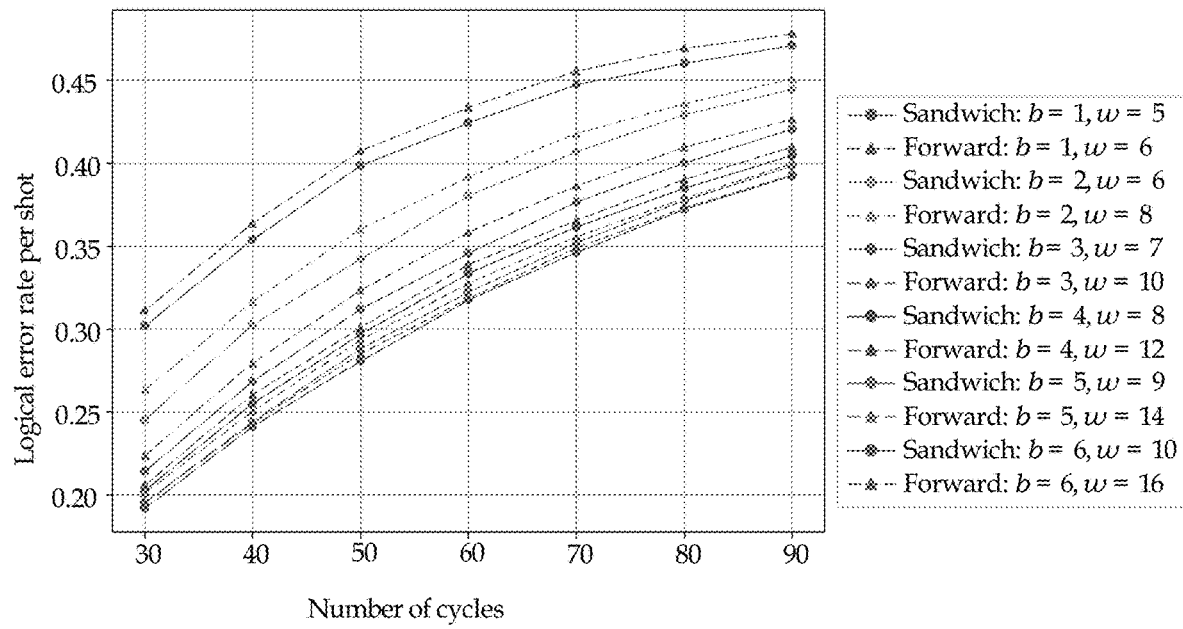
FIGS. 10A and 10B depicts the dependence of logical error rate per shot and per d of cycle on window architecture, consistent with disclosed embodiments.
Figure 10B:
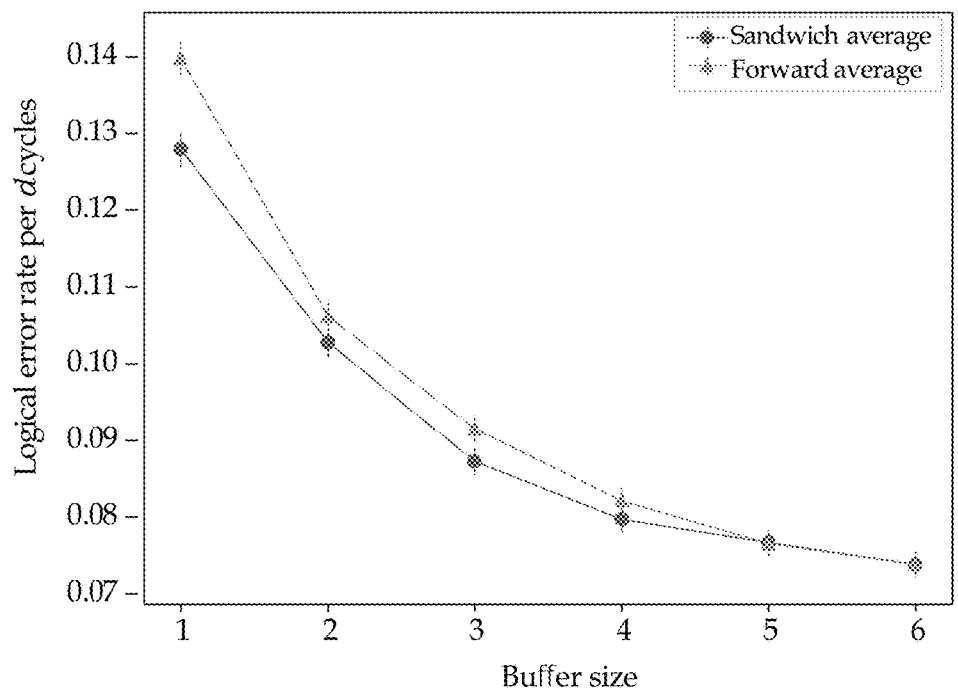

FIGS. 10A and 10B depict the dependence of logical error rate per shot (FIG. 10A) and per d of cycle (FIG. 10B) on window architecture (forward window versus sandwich window) when d=9 and p=0.005, step size is s=4, and the number of cycles is 30 to 90, consistent with disclosed embodiments. As depicted, when same number of future events are released to both sandwich windows and forward windows (i.e., fix the step size and the overlap), the sandwich windows produce lower logical error rates. The forward window size was s+b and the sandwich window size was s+2b. Accordingly, given any forward window decoder, a sandwich window decoder can be constructed with comparably good or better performance.

The performance of windows with closed upper- and lower-time boundaries was compared with the normal case where only the lower time boundary of the first window and the upper time boundary of the last window are closed. Open boundaries have obvious advantage over closed boundaries. As overlap increases, this advantage becomes less obvious.

Figure 11A:
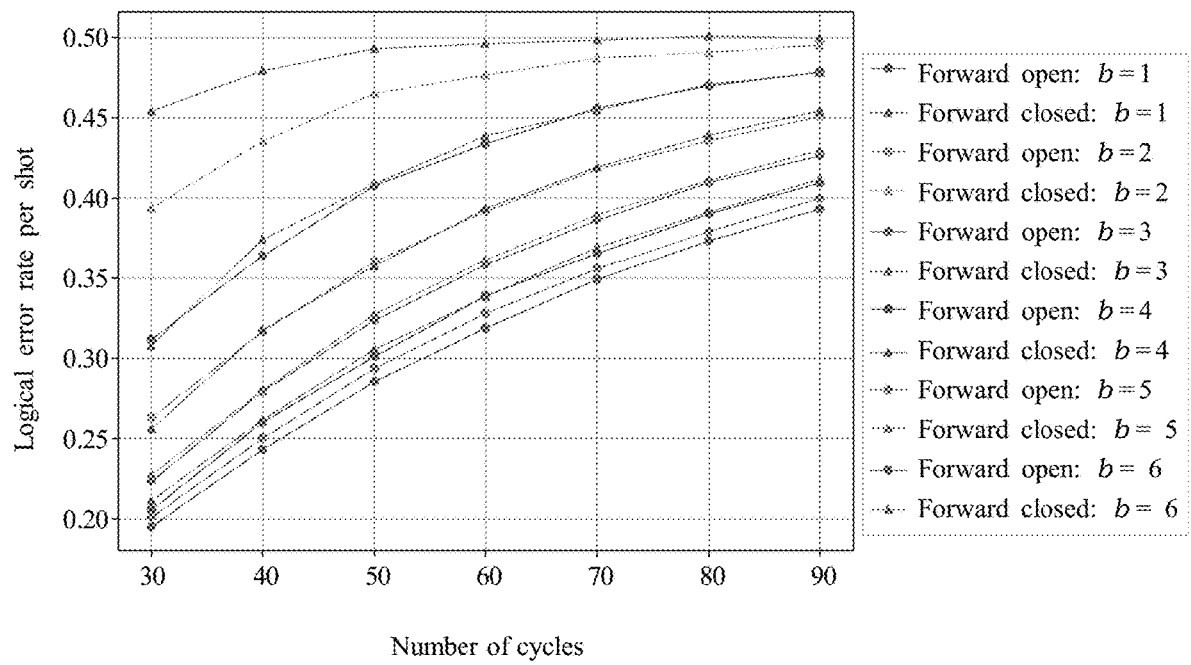
FIGS. 11A and 11B depict the dependence of logical error rate per shot and per d of cycle on closed or open window boundaries for forward windows, consistent with disclosed embodiments.
Figure 11B:
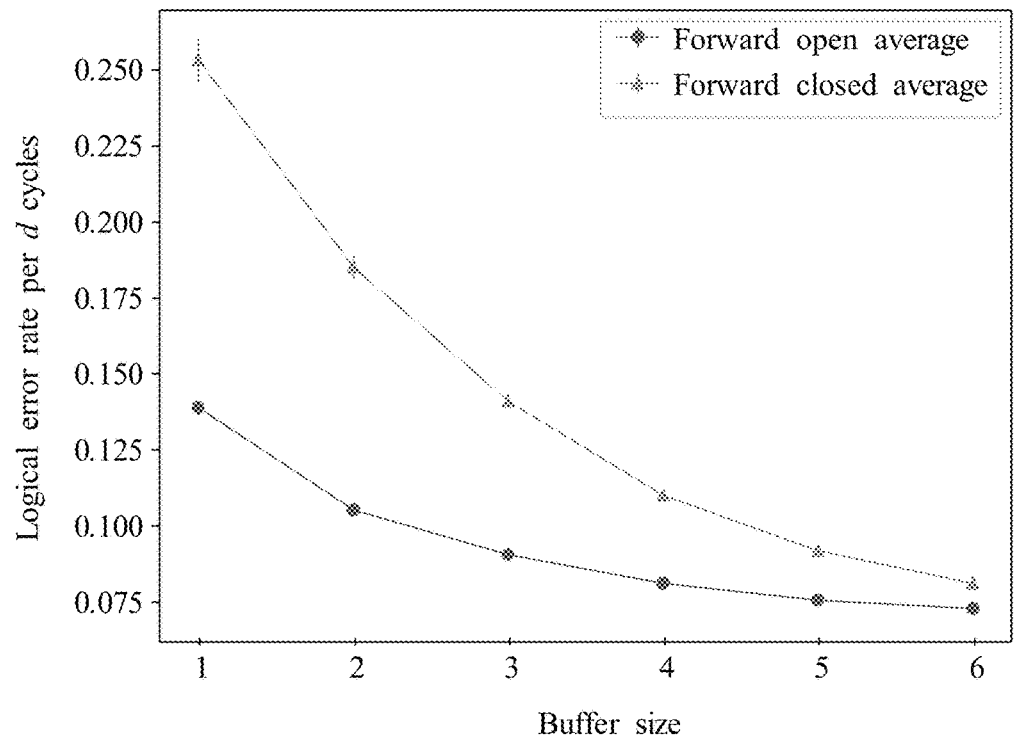

FIGS. 11A and 11B depict the dependence of logical error rate per shot (FIG. 11A) and per d of cycle (FIG. 11B) on closed or open window boundaries for forward sliding windows when d=9 and p=0.005, window size is 4, and numbers of cycles ranges from 30 to 90, consistent with disclosed embodiments. In FIG. 11A, the overlap is varied from 1 to 6 for each of closed and open boundaries. In FIG. 11B, logical error rates per shot are converted to logical error rates per d cycles and plotted against overlap.

Figure 11C:
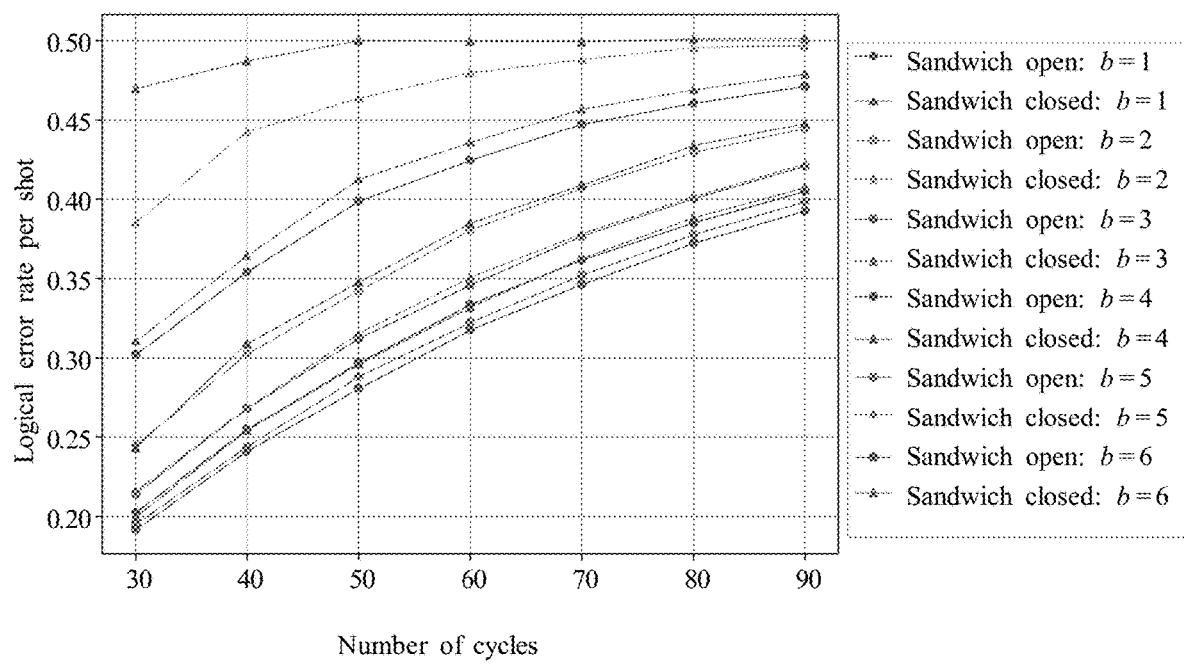
FIGS. 11C and 11D depict the dependence of logical error rate per shot and per d of cycle on closed or open window boundaries for sandwich windows, consistent with disclosed embodiments.
Figure 11D:
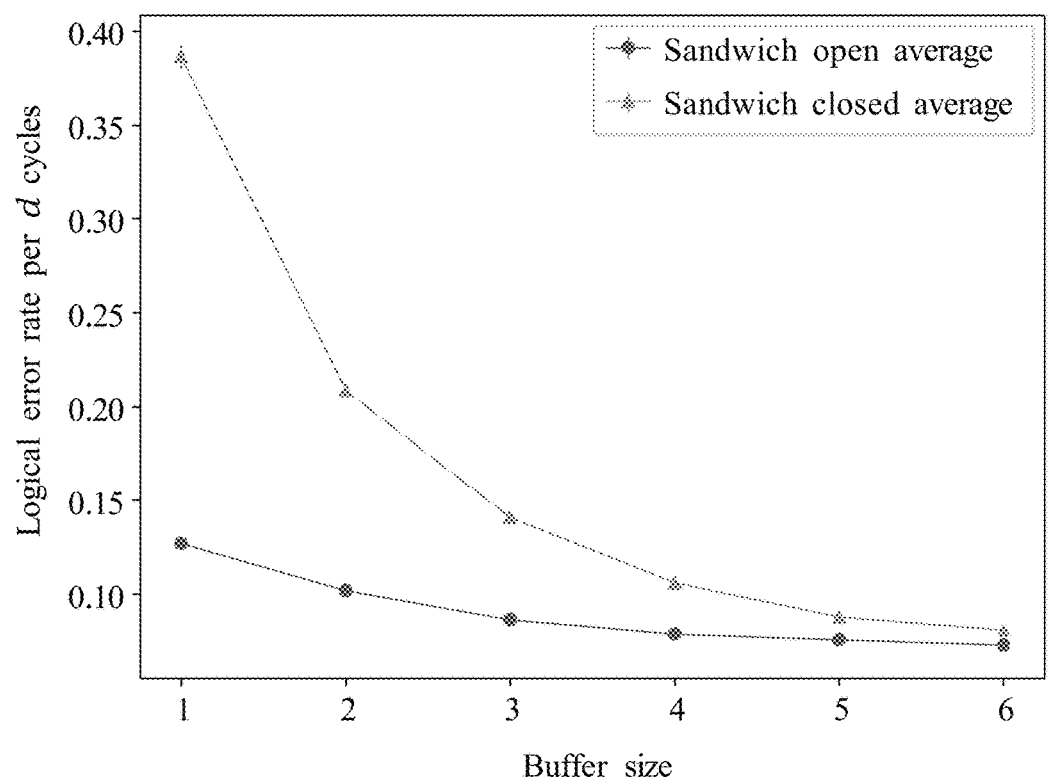

FIGS. 11C and 11D depict the dependence of logical error rate per shot (FIG. 11C) and per d of cycle (FIG. 11D) on closed or open window boundaries for sandwich windows when d=9 and p=0.005, window size is 4, and numbers of cycles ranges from 30 to 90, consistent with disclosed embodiments. In FIG. 11C, the overlap is varied from 1 to 6 for each of closed and open boundaries. In FIG. 11D, logical error rates per shot are converted to logical error rates per d cycles and plotted against overlap.

Figure 12A:
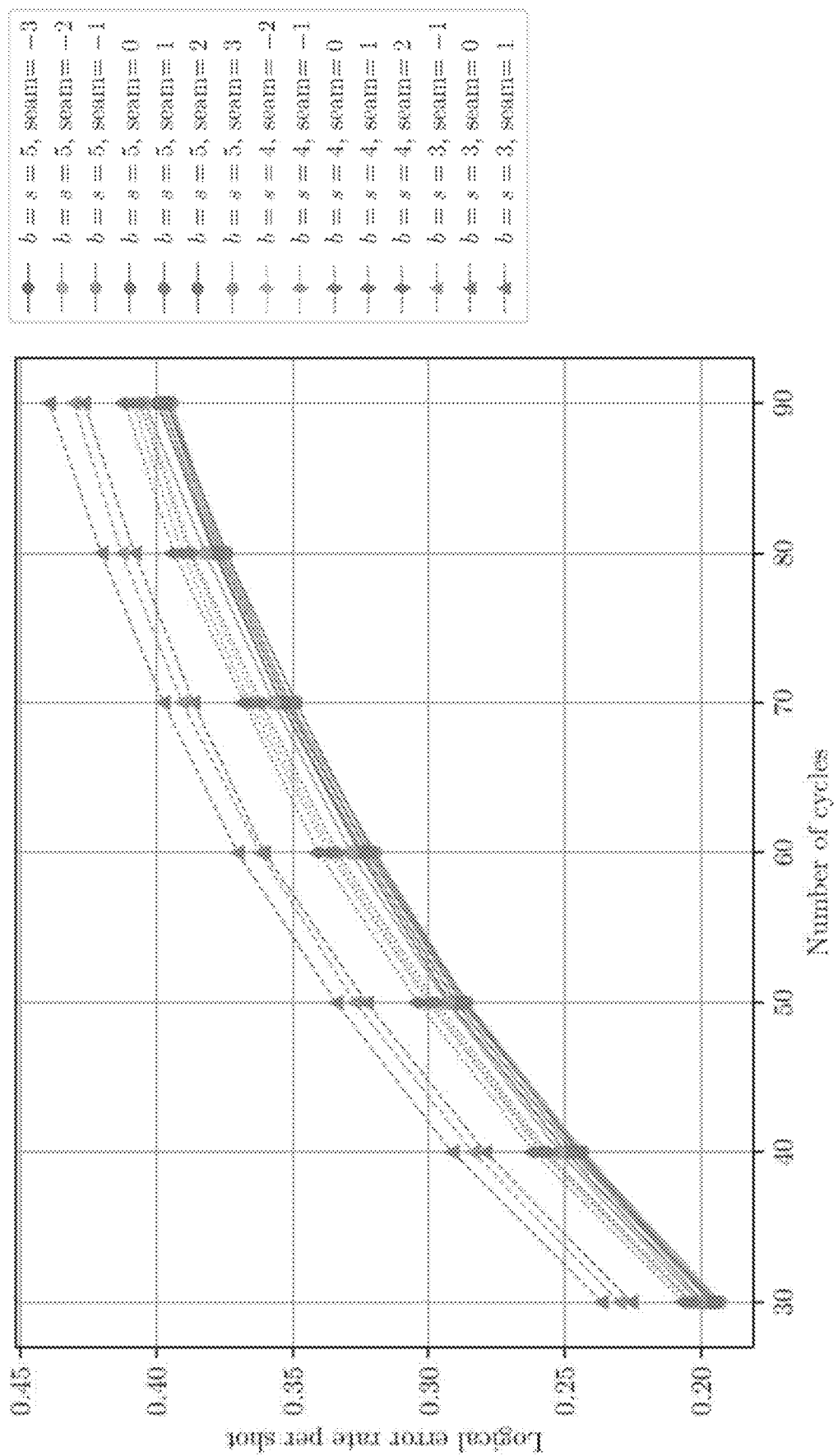
FIGS. 12A and 12B depict the dependence of logical error rate per shot and per d of cycle of differing boundary offsets, consistent with disclosed embodiments.
Figure 12B:
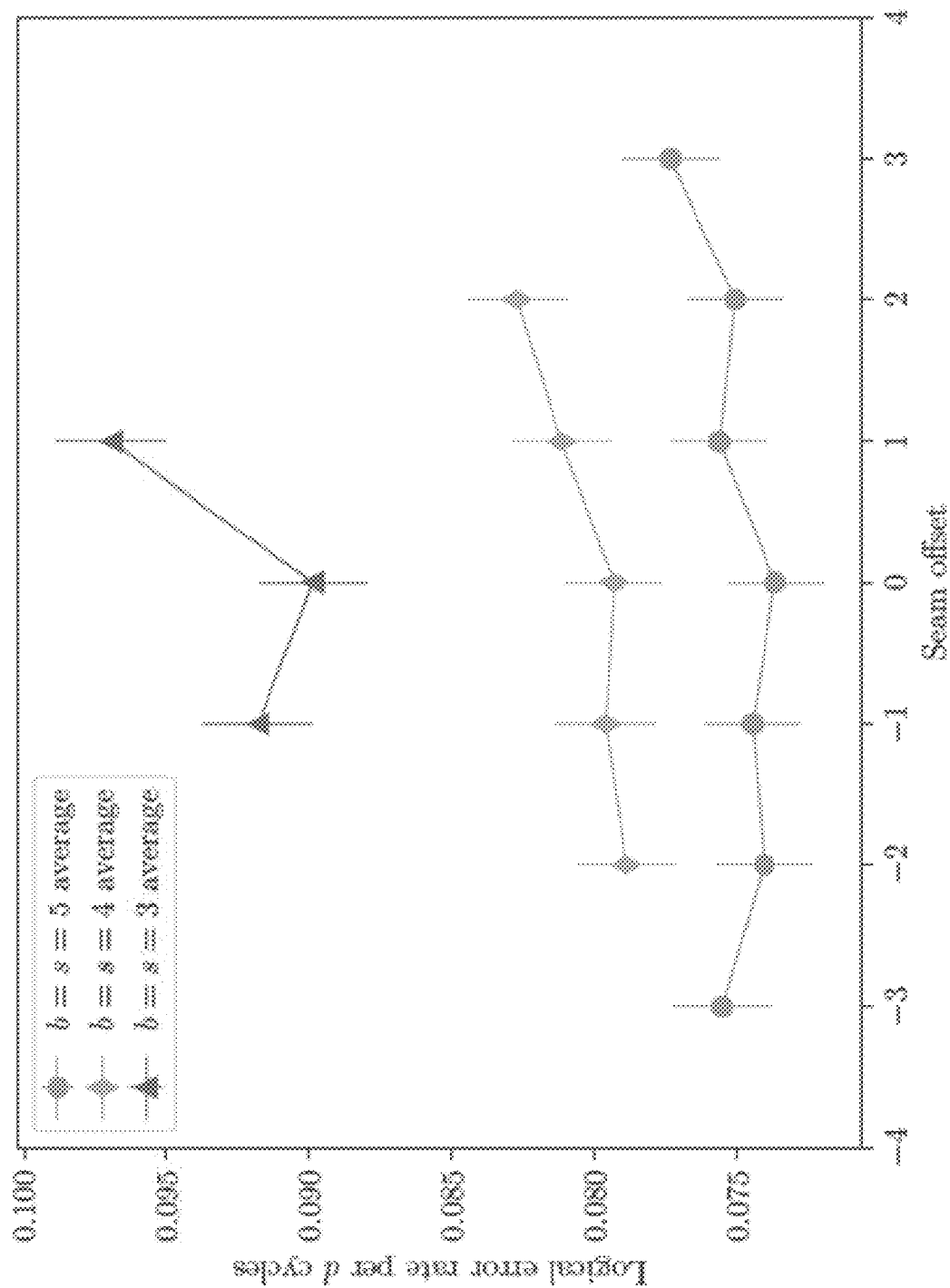

FIGS. 12A and 12B depict the dependence of logical error rate per shot (FIG. 12A) and per d of cycle (FIG. 12B) of differing boundary offsets, when d=9 and p=0.005, window size is s+2b, number of cycles ranges from 30 to 90, and boundary offsets range from −3 to 3, consistent with disclosed embodiments. Step size and overlap were fixed at 5, 4, and 3.

Figure 13:
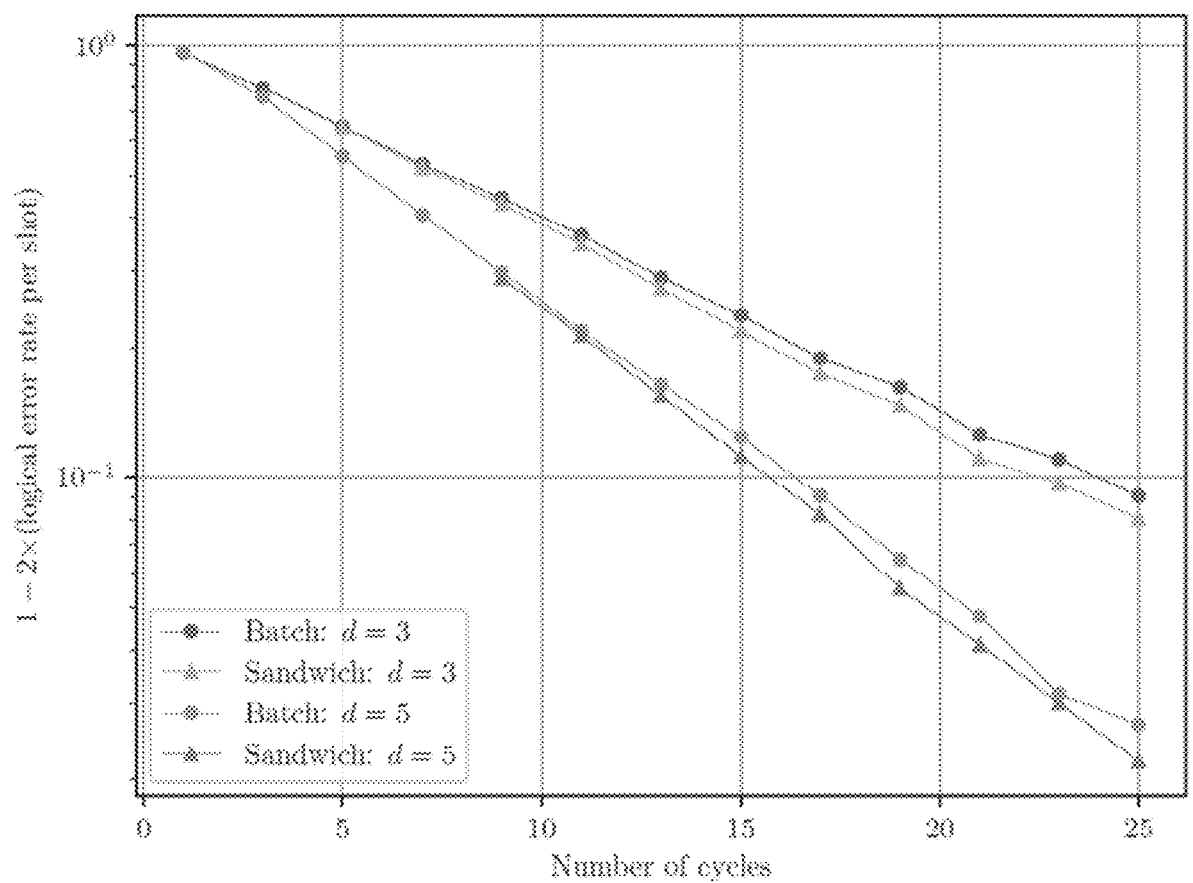
FIG. 13 depicts the performance of sandwich decoders as compared to batch decoders on real-world data, consistent with disclosed embodiments.

The performance of the sliding window (UF) decoders was evaluated on real-world data provided in "Suppressing quantum errors by scaling a surface code logical qubit" by R. Acharya et al. ("Acharya") for d=3 and d=5. FIG. 13 depicts application of decoders to Google QEC data, consistent with disclosed embodiments. For d=3, each point was the average of 4 configurations of the surface codes as specified in Acharya. There was only one configuration when d=5. Each configuration has 50,000 shots. The batch decoder was a single UF decoder. The sandwich window decoder chosen has the step size of (d+1)/2 and the window size of 3(d+1)/2. The y-axis is the logical fidelity $1-2p_L^c$ and c is the number of cycles. The slope indicates the logical error rate per cycle. As shown in FIG. 13, the sandwich decoders only have slightly larger logical error rates compared with using the batch (UF) decoders. Notice that the original data was obtained using tensor network and belief decoders, which inherently have higher accuracy than UF decoders, to obtain the suppression of errors from d=3 to d=5.

The surface code patch used in a stability experiment can have closed space boundaries on all sides. The decoder graph for a "boundary decoder" may not have any open boundary at all. But the decoder graph can still get an odd number of detection events as the input if two adjacent windows yield completely different corrections. Furthermore, it takes only O(m) errors to cause such an irreconcilable consistency, whereas the stability experiment is supposed to be able to tolerate any O(n) errors (remember that in our notations, n is the total number of cycles in the experiment and m is the number of cycles in a window).

A motivation for the stability experiment is to emulate the "space-like parts" that arise in various useful logical operations with lattice surgery, such as moving a qubit or doing a two-qubit parity measurement. Each of those "space-like part" may last only for O(d) surface code cycles, since adding more cycles can have diminishing return for suppressing time-like logical errors and can be detrimental for suppressing space-like logical errors (of the opposite X/Z type). The stability experiment need not be divided into windows by time, as opposed to the memory experiment, which in "practical" scenarios can last much more than O(d) cycles (depending on the number of logical operations applied on a logical qubit). The spatial span of a "space-like part" may be significantly larger than d, depending on the physical distance on the surface code lattice between the qubits involved. Thus, stability experiments may be considered on an elongated rectangular code patch. The elongated rectangular code patch can be divided into windows in a spatial direction. Such a sliding-window decoder may be formulated by switching the roles of time and one spatial dimension.

The disclosed embodiments can be generalized to operations in lattice surgery, such as qubit movements and two-qubit parity measurements. For example, the two-qubit parity measurement can have an overall decoder graph with the shape of an "H", as depicted in FIG. 14A, as opposed to the rectangular box-shaped decoder graph for the memory experiment (where the box is elongated in the temporal direction) or the stability experiment (where the box is elongated in a spatial direction). However, the two-qubit parity measurement decoder graph can be divided into smaller decoder windows each with dimensions O(d)×O(d)× O(d), as depicted in FIG. 14B. The only significant difference is that there are two T-shaped windows which propagate boundary syndromes in three directions instead of two. Other lattice surgery operations may add more complexity to the scheme (e.g., a twist defect may require combining the X decoder graph and the Z decoder graph).

The disclosed embodiments include a general parallel divide-and-conquer method. Given a stabilizer code and its syndrome-extraction circuit, denote by V the set of detectors. Then a stochastic Pauli noise model induces a (hyper) graph (V; E) with E={e⊆V:there is a fault that flips exactly the detectors in e}. Consider the $\mathbb{F}$ 2-linear map from the edge space to the vertex space δ: $\mathbb{F}_2^{|E|} \to \mathbb{F}_2^{|V|}$, $$\delta E := \sum_{e \in E} \sum_{v \in e} v$$

where the vector addition corresponds to symmetric difference. For each v⊆V and e∈ E, define Δ(E,V):= {e∈ E: e incident to a vertex in V}

Then, the Generalized Sandwich method takes as the input the graph (V; E) and a set D⊆V of defects, outputs a set K∈ E of corrections, such that δK=D.

The method assumes that there is an "inner decoder", which is applied to instances of a small enough size. Given fixed defects D, corrections K can be "valid" if δK=D. If the inner decoder fails to find valid corrections at any instance, the decoder terminates and declares failure. The method also assumes a "partition method" for decomposing the input graph in Step 3. Note that each execution of the step does not necessarily partition the vertex set, but the "cores" from all the recursive steps put together do for the initial input graph.

The method provides a generalization of the sandwich decoder regarding disjoint core regions across windows (such as having non-negative boundary offset). Similar variants can be constructed for overlapping core regions. Let ⊔ denote the union of disjoint sets.

| Generalized Sandwich Decoder GS(V, E, D) |
| --- |
| 1: if (V, E) consists of disconnected subgraphs, each of a small enough size then |
| 2:    Apply the inner decoder to each subgraph in parallel, return the union of the outputs |
| 3: Apply the partition method to choose "cores" {$C_i \subseteq$ V}, with disjoint {Δ(E, $C_i$)}, each of a small enough size |
| 4: Apply the inner decoder in parallel to calculate corrections $K_i \subseteq$ Δ(E, $C_i$), for all i, with δK, ∩$C_i$ = D ∩ $C_i$ |
| 5: V' ← V⊔$C_i$, E' ← E⊔Δ(E, $C_i$), D' ← D + δ(⊔ $K_i$) |
| 6: return GS(V', E', D')⊔⊔, $K_i$ |

The method always terminates after finite recursions since |V| is strictly increasing. The emphasis of the method is on how to parallelize the computation. When the method does not fail, the output is valid. To see this, first observe that Step 5 defines a valid input instance, i.e., all vertices involved in E' are in V', and D'⊆V'. The former follows from the definition of E' and V'. To see the latter, note:

$$D' := D + \partial\left(\bigsqcup_i K_i\right) =$$

$$D + \sum_i \partial(K_i) = V' \cap D + \sum_i [(D \cap C_i) + C_i \cap \partial(K_i) + \overline{C}_i \cap \partial(K_i)],$$

where $\overline{C}_i$ denotes the set complement of $C_i$. It then follows from δK∩$C_i$=D∩$C_i$ as required in step 4 that $$V' \cap D + \sum_i (\overline{C}_i \cap \partial(K_i))$$

Note that for all i, $\overline{C}_i \cap \delta(K_i) \subseteq$ V', for otherwise there will be a j, j≠i such that Δ(E, $C_i$)∩Δ(E, $C_j$) has an element in δ($K_i$), a contradiction to the disjointedness of {Δ(E, $C_i$)}$_i$. Therefore D'⊆V'.

By inductive argument $$\partial\left(GS(V', E', D') \sqcup \bigsqcup_i K_i\right) =$$

$$\partial(GS(V', E', D')) + \partial\left(\bigsqcup_i K_i\right) = D' + \partial\left(\bigsqcup_i K_i\right) = D.$$

Thus, the method outputs valid corrections, provided it does not fail. The method also leaves significant freedom in choosing the inner decoder and the partition method. In some embodiments, the sandwich decoder can partition the input graph along the time direction, which disconnects the graph, resulting in a depth-2 recursion. The sandwich decoder can also guarantee success based on the graph properties of the windows. In some embodiments, alternative inner decoder can be or include pre-computed lookup tables, when one sets the base input size to be small enough.

FIG. 15 depicts a schematic of an exemplary quantum circuit 1510 suitable for implementing quantum error correction, in accordance with disclosed embodiments. Quantum circuit 1510 can include one or more qubits. In the non-limiting example depicted in FIG. 15, quantum circuit 1510 can include two fluxonium qubits. To continue this example, each of the fluxonium qubit can be implemented using a Josephson junction shunted by a capacitor and an inductor. Each of these inductors can be realized by an array of Josephson junctions. Each of the qubits can be constructed to operate at a local minimum in frequency with regards to a biasing magnetic flux. In this non-limiting example, the qubits can be coupled using a capacitor, implementing transverse resonant coupling (e.g., charge-coupled, or the like) between the qubits. Such coupling may require alignment of the qubit frequencies. When the gate is not in operation, the qubits can be maintained as different frequencies.

In some embodiments, circuit 1510 can be realized using a chip containing the qubits and the coupling between the qubits. In some embodiments, the chip can include one of more couplings to quantum controller 1520.

Quantum controller 1520 can be a digital computing device (e.g., a computing device including a central processing unit, graphical processing unit, application specific integrated circuit, field-programmable gate array, or other suitable processor). Quantum controller 1520 can configure quantum circuit 1510 for computation, provide computational gates, and read state information out of quantum circuit 1510.

Consistent with disclosed embodiments, quantum controller 1520 can configure quantum circuit 1510 by enabling a gate operation to be performed on one or more qubits of circuit quantum 1510. In some embodiments, quantum circuit 1510 can be configured by providing one or more bias drives to move two qubits into resonance. Quantum controller 1520 can provide the one or more bias drives directly to circuit 1510 or can provide instructions to a bias drive source (e.g., waveform generator or the like), causing the bias drive source to provide the bias drives to circuit 1510. In some embodiments, providing the bias drive can include passing current through a coil external to circuit 1510. In various embodiments, providing the bias drive can include passing current through a coil on the chip. The disclosed embodiments are not limited to a particular method of providing the bias drive or a particular method of biasing the qubits.

Consistent with disclosed embodiments, quantum controller 1520 can implement computational gates on circuit 1510. Quantum controller 1520 can implement such gates by providing one or more computational drives to corresponding qubits in circuit 1510, or by providing instructions to a computation drive source (e.g., a waveform generator or the like), causing the computational drive source to provide the one or more computational drives to circuit 1510. Such computational drives can include a microwave drives. The computational drives can include sinusoidal waves, square waves, pulse trains, or other quantum gate drives having parameters selected by the quantum controller 1520 to implement quantum gates on the qubits. The one or more computational drives can be provided the corresponding qubits using one or more coils coupled to the corresponding qubits. The coils can be external to circuit 1510 or on a chip containing circuit 1510.

Consistent with disclosed embodiments, quantum controller 1520 can be configured to determine state information for quantum circuit 1510. In some embodiments, quantum controller 1520 can measurement a state of one or more qubits of circuit 1510. The state can be measured upon completion of a sequence of one or more quantum operations. In some embodiments, quantum controller 1520 can provide a probe signal (e.g., a microwave probe tone) to a coupled resonator of circuit 1510, or provide instructions to a readout device (e.g., an arbitrary waveform generator) that provides the probe signal. In various embodiments, quantum controller 1520 can include, or be configured to receive information from, a detector configured to determine an amplitude and phase of an output signal received from the coupled resonator in response to provision of the microwave probe tone. The amplitude and phase of the output signal can be used to determine the state of the probed qubit(s). The disclosed embodiments are not limited to any particular method of measuring the state of the qubits.

The disclosed embodiments may further be described using the following clauses:

1. A method of quantum error correction, comprising: obtaining multiple cycles of error syndromes for a surface code; generating a decoder graph using the error syndromes; determining first corrections that annihilate faults within a first decoder window on the decoder graph, the first decoder window having two open time boundaries; retaining first corrections on a core region of the first decoder window, the core region having a first boundary; determining second corrections that annihilate faults within a second decoder window on the decoder graph, the second decoder window having two closed time boundaries, a first one of the two closed time boundaries being the first boundary; and providing an indication of the retained first corrections and the second corrections to enable correction of the surface code.

2. The method of clause 1, wherein: generating the decoder graph comprises determining vertices corresponding to real detectors, a first pair of the real detectors being connected by a first edge when a first fault in a first data qubit of the surface code flips a value of both real detectors in the first pair.

3. The method of clause 2, wherein: generating the decoder graph further comprises determining vertices corresponding to imaginary detectors, a second pair including an imaginary detector and a real detector being connected by a second edge when a second fault in a second data qubit of the surface code flips, among the real detectors, only a value of the real detector in the second pair.

4. The method of any one of clauses 1 to 3, wherein: the decoder graph is a z-type decoder graph having closed temporal boundaries and open spatial boundaries.

5. The method of any one of clauses 1 to 4, wherein: retaining the first corrections on the core region of the first decoder window creates a fault on the first boundary; and the second corrections annihilate the created fault on the first boundary.

6. The method of any one of clauses 1 to 5, wherein: the second decoder window is a 2D decoder graph.

7. The method of any one of clauses 1 to 5, further comprising: determining third corrections that annihilate faults within a third decoder window on the decoder graph, the third decoder window having two open time boundaries; retaining third corrections on a core region of the third decoder window, the core region having a third boundary; and wherein a second one of the two closed time boundaries is the third boundary.

8. The method of clause 7, wherein: the second one of the two closed time boundaries corresponds to an earlier cycle of detectors than the first one of the two closed time boundaries.

9. The method of any one of clauses 1 to 8, wherein: determining the first corrections comprises applying a union-find (UF) decoder or a minimum-weight perfect matching (MWPM) decoder to the first decoder window.

10. The method of any one of clauses 1 to 9, further comprising: determining corrections for multiple decoding windows having open temporal boundaries at least partially in parallel, the corrections including the first corrections.

11. A system for quantum error correction, comprising: at least one processor; and at least one computer readable medium containing instructions that, when executed by the at least one processor, cause the system to perform operations comprising: obtaining multiple cycles of error syndromes for a surface code; generating a decoder graph using the error syndromes; determining first corrections that annihilate faults within a first decoder window on the decoder graph, the first decoder window having two open time boundaries; retaining first corrections on a core region of the first decoder window, the core region having a first boundary; determining second corrections that annihilate faults within a second decoder window on the decoder graph, the second decoder window having two closed time boundaries, a first one of the two closed time boundaries being the first boundary; and providing an indication of the retained first corrections and the second corrections to enable correction of the surface code.

12. The system of clause 11, wherein: generating the decoder graph comprises determining vertices corresponding to real detectors, a first pair of the real detectors being connected by a first edge when a first fault in a first data qubit of the surface code flips a value of both real detectors in the first pair.

13. The system of clause 12, wherein: generating the decoder graph further comprises determining vertices corresponding to imaginary detectors, a second pair including an imaginary detector and a real detector being connected by a second edge when a second fault in a second data qubit of the surface code flips, among the real detectors, only a value of the real detector in the second pair.

14. The system of any one of clauses 11 to 13, wherein: the decoder graph is a z-type decoder graph having closed temporal boundaries and open spatial boundaries.

15. The system of any one of clauses 11 to 14, wherein: retaining the first corrections on the core region of the first decoder window creates a fault on the first boundary; and the second corrections annihilate the created fault on the first boundary.

16. The system of any one of clauses 11 to 15, wherein: the second decoder window is a 2D decoder graph.

17. The system of any one of clauses 11 to 15, wherein the operations further comprise: determining third corrections that annihilate faults within a third decoder window on the decoder graph, the third decoder window having two open time boundaries; retaining third corrections on a core region of the third decoder window, the core region having a third boundary; and wherein a second one of the two closed time boundaries is the third boundary.

18. The system of clause 17, wherein: the second one of the two closed time boundaries corresponds to an earlier cycle of detectors than the first one of the two closed time boundaries.

19. The system of any one of clauses 11 to 18, wherein: determining the first corrections comprises applying a union-find (UF) decoder or a minimum-weight perfect matching (MWPM) decoder to the first decoder window.

20. The system of any one of clauses 11 to 19, wherein the operations further comprise: determining corrections for multiple decoding windows having open temporal boundaries at least partially in parallel, the corrections including the first corrections.

The foregoing description has been presented for purposes of illustration. It is not exhaustive and is not limited to precise forms or embodiments disclosed. Modifications and adaptations of the embodiments will be apparent from consideration of the specification and practice of the disclosed embodiments. For example, the described implementations include hardware, but systems and methods consistent with the present disclosure can be implemented with hardware and software. In addition, while certain components have been described as being coupled to one another, such components may be integrated with one another or distributed in any suitable fashion.

Moreover, while illustrative embodiments have been described herein, the scope includes any and all embodiments having equivalent elements, modifications, omissions, combinations (e.g., of aspects across various embodiments), adaptations or alterations based on the present disclosure. The elements in the claims are to be interpreted broadly based on the language employed in the claims and not limited to examples described in the present specification or during the prosecution of the application, which examples are to be construed as nonexclusive. Further, the steps of the disclosed methods can be modified in any manner, including reordering steps or inserting or deleting steps.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Further, since numerous modifications and variations will readily occur from studying the present disclosure, it is not desired to limit the disclosure to the exact construction and operation illustrated and described, and accordingly, all suitable modifications and equivalents may be resorted to, falling within the scope of the disclosure.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Other embodiments will be apparent from consideration of the specification and practice of the embodiments disclosed herein. It is intended that the specification and examples be considered as example only, with a true scope and spirit of the disclosed embodiments being indicated by the following claims.

What is claimed is:

1. A method of quantum computation, comprising:
performing a quantum computation using a surface code, performance of the quantum computation including:
determination of error correction information for the quantum computation, the determination comprising:
obtaining multiple cycles of error syndromes for the surface code;
determining first corrections that annihilate faults within a first decoder window on a decoder graph generated using the error syndromes, the first decoder window having two open time boundaries;
retaining first corrections on a core region of the first decoder window, the core region having a first boundary;
determining second corrections that annihilate faults within a second decoder window on the decoder graph, the second decoder window having two closed time boundaries, a first one of the two closed time boundaries being the first boundary; and
wherein the error correction information includes or depends upon the first and second corrections;
measuring a result of the quantum computation; and
correcting the result of the quantum computation using the error correction information.

2. The method of claim 1, wherein:
the decoder graph comprises includes vertices corresponding to real detectors, a first pair of the real detectors being connected by a first edge when a first fault in a first data qubit of the surface code flips a value of both real detectors in the first pair.

3. The method of claim 2, wherein:
the decoder graph further includes vertices corresponding to imaginary detectors, a second pair including an imaginary detector and a real detector being connected by a second edge when a second fault in a second data qubit of the surface code flips, among the real detectors, only a value of the real detector in the second pair.

4. The method of claim 1, wherein:
the decoder graph is a z-type decoder graph having closed temporal boundaries and open spatial boundaries.

5. The method of claim 1, wherein:
retaining the first corrections on the core region of the first decoder window creates a fault on the first boundary; and
the second corrections annihilate the created fault on the first boundary.

6. The method of claim 1, wherein:
the second decoder window is a 2D decoder graph.

7. The method of claim 1, further comprising:
determining third corrections that annihilate faults within a third decoder window on the decoder graph, the third decoder window having two open time boundaries;
retaining third corrections on a core region of the third decoder window, the core region having a third boundary; and
wherein a second one of the two closed time boundaries is the third boundary.

8. The method of claim 7, wherein:
the second one of the two closed time boundaries corresponds to an earlier cycle of detectors than the first one of the two closed time boundaries.

9. The method of claim 1, wherein:
determining the first corrections comprises applying a union-find (UF) decoder or a minimum-weight perfect matching (MWPM) decoder to the first decoder window.

10. The method of claim 1, further comprising:
determining corrections for multiple decoding windows having open temporal boundaries at least partially in parallel, the corrections including the first corrections.

11. A system for quantum computation, comprising:
at least one processor; and
at least one computer readable medium containing instructions that, when executed by the at least one processor, cause the system to perform a quantum computation using a surface code, performance of the quantum computation including:
  determination of error correction information for the quantum computation, the determination comprising:
    obtaining multiple cycles of error syndromes for the surface code;
    determining first corrections that annihilate faults within a first decoder window on a decoder graph generated using the error syndromes, the first decoder window having two open time boundaries;
    retaining first corrections on a core region of the first decoder window, the core region having a first boundary;
    determining second corrections that annihilate faults within a second decoder window on the decoder graph, the second decoder window having two closed time boundaries, a first one of the two closed time boundaries being the first boundary; and
    wherein the error correction information includes or depends upon the first and second corrections;
  measuring a result of the quantum computation; and
  correcting the result of the quantum computation using the error correction information.

12. The system of claim 11, wherein:
the decoder graph comprises includes vertices corresponding to real detectors, a first pair of the real detectors being connected by a first edge when a first fault in a first data qubit of the surface code flips a value of both real detectors in the first pair.

13. The system of claim 12, wherein:
the decoder graph further includes vertices corresponding to imaginary detectors, a second pair including an imaginary detector and a real detector being connected by a second edge when a second fault in a second data qubit of the surface code flips, among the real detectors, only a value of the real detector in the second pair.

14. The system of claim 11, wherein:
the decoder graph is a z-type decoder graph having closed temporal boundaries and open spatial boundaries.

15. The system of claim 11, wherein:
retaining the first corrections on the core region of the first decoder window creates a fault on the first boundary; and
the second corrections annihilate the created fault on the first boundary.

16. The system of claim 11, wherein:
the second decoder window is a 2D decoder graph.

17. The system of claim 11, wherein the performance of the quantum computation further includes:
determining third corrections that annihilate faults within a third decoder window on the decoder graph, the third decoder window having two open time boundaries;
retaining third corrections on a core region of the third decoder window, the core region having a third boundary; and
wherein a second one of the two closed time boundaries is the third boundary.

18. The system of claim 17, wherein:
the second one of the two closed time boundaries corresponds to an earlier cycle of detectors than the first one of the two closed time boundaries.

19. The system of claim 11, wherein:
determining the first corrections comprises applying a union-find (UF) decoder or a minimum-weight perfect matching (MWPM) decoder to the first decoder window.

20. The system of claim 11, wherein the performance of the quantum computation further includes:
determining corrections for multiple decoding windows having open temporal boundaries at least partially in parallel, the corrections including the first corrections.

* * * * *